US011352555B2

(12) United States Patent
Park et al.

(10) Patent No.: US 11,352,555 B2
(45) Date of Patent: Jun. 7, 2022

(54) COMPOSITION, QUANTUM DOT-POLYMER COMPOSITE, AND DISPLAY DEVICE INCLUDING SAME

(71) Applicant: SAMSUNG ELECTRONICS CO., LTD., Suwon-si (KR)

(72) Inventors: Shang Hyeun Park, Yongin-si (KR); Jong-Hoon Ka, Ulsan-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 343 days.

(21) Appl. No.: 16/532,888

(22) Filed: Aug. 6, 2019

(65) Prior Publication Data
US 2020/0040255 A1 Feb. 6, 2020

(30) Foreign Application Priority Data

Aug. 6, 2018 (KR) .................. 10-2018-0091271

(51) Int. Cl.
C09K 11/02 (2006.01)
C09K 11/70 (2006.01)
C09K 11/08 (2006.01)
G02F 1/13357 (2006.01)
H01L 27/32 (2006.01)
H01L 51/50 (2006.01)
G02F 1/1335 (2006.01)

(52) U.S. Cl.
CPC .......... C09K 11/02 (2013.01); C09K 11/0883 (2013.01); C09K 11/703 (2013.01); G02F 1/1336 (2013.01); G02F 1/133617 (2013.01); H01L 27/322 (2013.01); H01L 51/502 (2013.01); G02F 1/133514 (2013.01); G02F 1/133614 (2021.01); H01L 2251/5353 (2013.01); H01L 2251/5369 (2013.01)

(58) Field of Classification Search
CPC ..... C09K 11/02; C09K 11/08; C09K 11/0883; C09K 11/703; C09K 11/025; H01L 51/502; H01L 2251/5369; H01L 51/5268; H01L 27/322; H01L 2251/5353; G02F 1/01791; G02F 1/1336; G02F 1/133617; G02F 1/133514; G02F 1/133614; G02F 1/1333
See application file for complete search history.

(56) References Cited

U.S. PATENT DOCUMENTS

| | | | |
|---|---|---|---|
| 2009/0195152 A1* | 8/2009 | Sawano | H01L 27/322 313/504 |
| 2017/0176854 A1* | 6/2017 | Park | G03F 7/027 |

FOREIGN PATENT DOCUMENTS

| | | |
|---|---|---|
| JP | 5826104 B2 | 12/2015 |
| KR | 20060056534 A | 5/2006 |
| KR | 1440728 B1 | 9/2014 |
| KR | 1444028 B1 | 9/2014 |
| KR | 1509611 B1 | 4/2015 |
| KR | 20160060904 A | 5/2016 |
| KR | 20170019277 A | 2/2017 |
| KR | 20170073019 A | 6/2017 |
| KR | 20170075386 A | 7/2017 |

OTHER PUBLICATIONS

Jungsup Lee et al., "Fabrication of SiO2/TiO2 Double-Shelled Hollow Nanospheres with Controllable Size via Sol-Gel Reaction and Sonication-Mediated Etching," ACS Applied Materials & Interfaces, Aug. 22, 2014, pp. 15420-15426, vol. 6.
Suim Son et al., "Designed synthesis of SiO2/TiO2 core/shell structure as light scattering material for highly efficient dye-sensitized solar cells," ACS Applied Materials & Interfaces, May 1, 2013, pp. 4815-4820, DOI: 10.1021/am400441v.
Wanghui Chen, "Solid and Hollow SiO2@TiO2 Core-Shell Particles: Fabrication and Evaluation on Their Photcatalytic Activity Towards the Degradation of Organics," Nagoya Institute of Technology Repository, Mar. 23, 2016, pp. 1-128.

* cited by examiner

Primary Examiner — Donald L Raleigh
(74) Attorney, Agent, or Firm — Cantor Colburn LLP

(57) ABSTRACT

A composition including a quantum dot, a dispersing agent for dispersing the quantum dot, a polymerizable monomer including a carbon-carbon double bond, an initiator, a hollow metal oxide particulate, and a solvent, and a quantum dot-polymer composite manufactured from the composition.

20 Claims, 15 Drawing Sheets

Pattern fabrication by using photoresist

3 Repetitive Pattern fabrication

COMPOSITION, QUANTUM DOT-POLYMER COMPOSITE, AND DISPLAY DEVICE INCLUDING SAME

CROSS-REFERENCE TO RELATED APPLICATION

This application claims priority to and the benefit of Korean Patent Application No. 10-2018-0091271 filed in the Korean Intellectual Property Office on Aug. 6, 2018, and all the benefits accruing therefrom under 35 U.S.C. § 119, the content of which in its entirety is herein incorporated by reference.

BACKGROUND

1. Field

A composition, a quantum dot-polymer composite manufactured from the same, and a display device including the same are disclosed.

2. Description of the Related Art

A quantum dot may be applied as a quantum dot-polymer composite to or in various display devices such as a liquid crystal display, an organic light emitting diode (OLED), and the like. The quantum dot should provide excellent color reproducibility and high photo-efficiency in order to be applied to or used in the display devices.

SUMMARY

An embodiment provides a composition for manufacturing a quantum dot-polymer composite.

An embodiment provides a quantum dot-polymer composite.

An embodiment provides a display device including the quantum dot-polymer composite.

An embodiment provides a composition including a quantum dot, a dispersing agent for dispersing the quantum dot, a polymerizable monomer including a carbon-carbon double bond, an initiator, a hollow metal oxide particulate, and a solvent.

The hollow metal oxide particulate may include a titanium oxide, a silicon oxide, a barium oxide, a zinc oxide, a zirconium oxide, or a combination thereof.

The hollow metal oxide particulate may include $TiO_2$, $SiO_2$, $BaTiO_3$, $Ba_2TiO_4$, $ZnO$, $ZrO_2$, or a combination thereof.

An average particle size of the hollow metal oxide particulate may range from about 200 nanometers (nm) to about 500 nm.

An average particle size of the hollow metal oxide particulate may range from about 250 nm to about 450 nm.

An average size of a hollow portion in the hollow metal oxide particulate may be greater than or equal to about 10 nm and less than about 500 nm.

The average size of a hollow portion in the hollow metal oxide particulate may be greater than or equal to about 30 nm and less than or equal to about 450 nm.

The quantum dot may include a Group II-VI compound, a Group III-V compound, a Group IV-VI compound, a Group IV element or compound, a Group I-III-VI compound, a Group I-II-IV-VI compound, or a combination thereof.

The dispersing agent may include a carboxyl group-containing polymer, wherein the carboxyl group-containing polymer may include a copolymer of a monomer combination including a first monomer including a carboxyl group and a carbon-carbon double bond, a second monomer including a carbon-carbon double bond and a hydrophobic moiety and not including a carboxyl group, and optionally a third monomer including a carbon-carbon double bond and a hydrophilic moiety and not including a carboxyl group;

a multiple aromatic ring-containing polymer including a backbone structure in which two aromatic rings are bound to a quaternary carbon atom that is a constituent atom of another cyclic moiety in the main chain and including a carboxyl group; or a combination thereof.

The carboxyl group-containing polymer may have an acid value of greater than or equal to about 50 milligrams of potassium hydroxide per gram (mg KOH/g) and less than or equal to about 240 mg KOH/g.

The composition may further include a thiol compound including a thiol group at a terminal end of the thiol compound.

The thiol compound may be represented by Chemical Formula 1:

Chemical Formula 1

In Chemical Formula 1, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; $—NH_2$; a substituted or unsubstituted C1 to C30 amine group —NRR', wherein R and R' are independently hydrogen or a C1 to C30 linear or branched alkyl group and are not simultaneously hydrogen; an isocyanate group —R-M=C=O, wherein R is a substituted or unsubstituted C1 to C20 alkylene group and M is an organic or inorganic cation; a halogen; —ROR', wherein R is a substituted or unsubstituted C1 to C20 alkylene group and R' is hydrogen or a C1 to C20 linear or branched alkyl group; an acyl halide —RC(=O)X, wherein R is a substituted or unsubstituted alkylene group and X is a halogen; —C(=O)OR', wherein R' is hydrogen or a C1 to C20 linear or branched alkyl group; —CN; —C(=O)ORR' or —C(=O)ONRR', wherein R and R' are independently hydrogen or a C1 to C20 linear or branched alkyl group, $L_1$ is a carbon atom, a substituted or unsubstituted C1 to C30 alkylene group, a substituted or unsubstituted C1 to C30 alkylene group wherein at least one methylene moiety ($—CH_2—$) is replaced by a sulfonyl moiety ($—SO_2—$), a carbonyl moiety (CO), —O—, —S—, —SO—, —C(=O)O—, —C(=O)NR—, wherein, R is hydrogen or a C1 to C10 alkyl group, or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene moiety, $Y_1$ is a single bond; a substituted or unsubstituted C1 to C30 alkylene group; a substituted or unsubstituted C2 to C30 alkenylene group; a C1 to C30 alkylene group or a C2 to C30 alkenylene group wherein at least one methylene moiety (—CH$_2$—) is replaced by a sulfonyl moiety (—S(=O)$_2$—), a carbonyl moiety (—C(=O)—), —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof, m is an integer of 1 or more,
k1 is 0 or an integer of 1 or more,
k2 is an integer of 1 or more, and
the sum of m and k2 is an integer of 3 or more, provided that m does not exceed the valence of $Y_1$ and the sum of k1 and k2 does not exceed the valence of $L_1$.

An amount of the quantum dot may be greater than or equal to about 10 weight percent (wt %) and an amount of the hollow metal oxide particulate may be greater than or equal to about 5 wt %, based on a total weight of solids in the composition.

An amount of the hollow metal oxide particulate may be about 5 wt % to about 80 wt %, based on a total weight of solids in the composition.

An embodiment provides a quantum dot-polymer composite. The quantum dot-polymer composite may be obtained by curing the composition according to an embodiment.

An embodiment provides a display device including a light source and a photoluminescent element, wherein the photoluminescent element includes the quantum dot-polymer composite according to an embodiment and the light source is configured to provide the photoluminescent element with incident light.

The incident light may have a photoluminescence peak wavelength of about 440 nm to about 460 nm.

The photoluminescent element may include a sheet including the quantum dot-polymer composite.

The photoluminescent element may be a stack structure including a substrate and a photoluminescent layer disposed on the substrate, wherein the photoluminescent layer includes a pattern of the quantum dot-polymer composite and the pattern includes at least one repetitive section configured to emit light at a predetermined wavelength.

The pattern may include a first section configured to emit a first light and a second section configured to emit a second light having a different center wavelength from the first light.

The composition according to an embodiment includes the hollow metal oxide particulate and thereby when light is provided with the quantum dot-polymer composite produced from the composition, the light may be scattered more efficiently. Accordingly, a photo-conversion of the quantum dot-polymer composite may be improved and a display device including the quantum dot-polymer composite may exhibit high luminance, high efficiency, and high color reproducibility.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
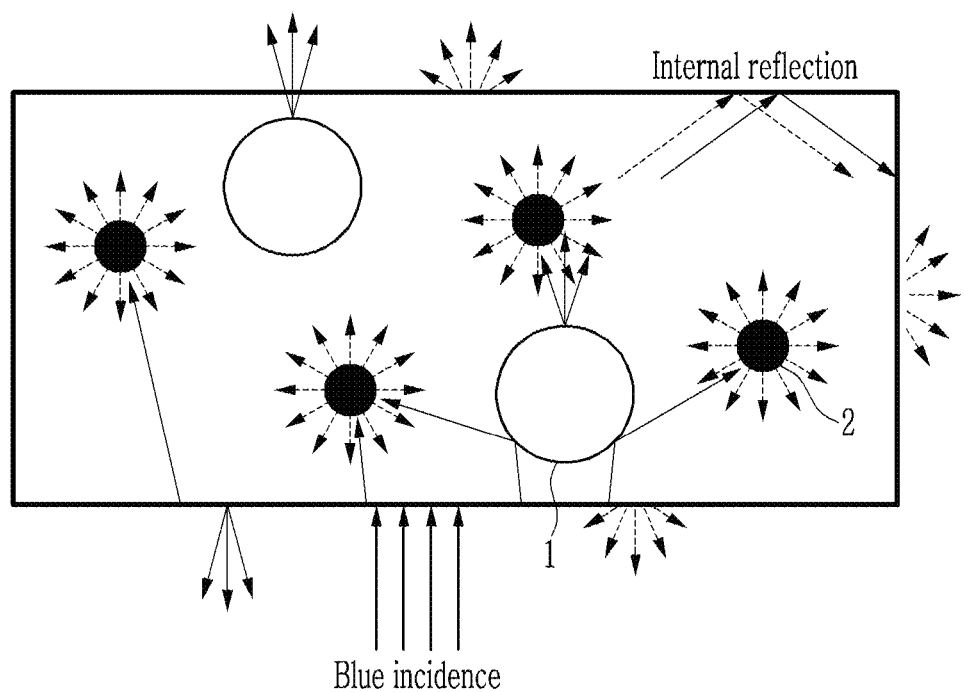
FIG. 1 is a schematic view showing that when a film-shaped quantum dot-polymer composite including a scattering body is radiated by incident light, a quantum dot 2 is excited by the incident light and emits light of a specific wavelength, and a scattering body 1 scatters the incident light, the emitted light by the quantum dot, or a combination thereof.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer," or "section" discussed below could be termed a second element, component, region, layer, or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to replacement of hydrogen of a compound, a group, or a moiety by a C1 to C30 alkyl group, a C2 to C30 alkenyl group, a C2 to C30 epoxy group, a C6 to C30 aryl group, a C7 to C30 alkylaryl group, a C1 to C30 alkoxy group, a C1 to C30 heteroalkyl group, a C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a thiocyanate group (—SCN), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

Herein, "functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, "hetero" refers to inclusion of one or more (e.g., one to three) heteroatoms, wherein the heteroatom(s) may be N, O, S, Si, or P.

As used herein, when a definition is not otherwise provided, "alkylene group" refers to a straight or branched saturated aliphatic hydrocarbon group having at least two valences and optionally substituted with at least one substituent.

As used herein, when a definition is not otherwise provided, "arylene group" refers to a functional group having at least two valences obtained by removal of at least two hydrogens in at least one aromatic ring, and optionally substituted with at least one substituent.

As used herein, when a definition is not otherwise provided, "aliphatic" refers to a C1 to C30 linear or branched hydrocarbon group (e.g., C1 to C30 alkyl, C2 to C30 alkenyl, C2 to C30 alkynyl).

As used herein, when a definition is not otherwise provided, "aromatic" refers to a C6 to C30 aryl group or a C2 to C30 heteroaryl group.

As used herein, when a definition is not otherwise provided, and "alicyclic" refers to a C3 to C30 cycloalkyl group, a C3 to C30 cycloalkenyl group, or a C3 to C30 cycloalkynyl group.

As used herein, when a definition is not otherwise provided, "heteroaryl" refers to an aromatic group that comprises at least one heteroatom covalently bonded to one or more carbon atoms of aromatic ring.

As used herein, when a definition is not otherwise provided, "(meth)acrylate" refers to acrylate, methacrylate, or a combination thereof.

As used herein, when a definition is not otherwise provided, "hydrophobic moiety" refers to a moiety providing the corresponding compound with a tendency to be agglomerated in an aqueous solution and to repel water.

For example, the hydrophobic moiety may be an aliphatic hydrocarbon group having a carbon number of 2 or greater (e.g., alkyl, alkenyl, alkynyl, etc.), an aromatic hydrocarbon group having a carbon number of 6 or greater (e.g., phenyl, naphthyl, aralkyl group, etc.), or an alicyclic hydrocarbon group having a carbon number of 5 or greater (e.g., cyclohexyl, norbornene, norbornane, tricyclodecane, etc.). The hydrophobic moiety may not be mixed with an ambient medium since the hydrophobic moiety may not be able to form a hydrogen bond with the ambient medium, or since the polarity of the hydrophobic moiety may not match the polarity of the ambient medium.

As used herein, "visible light" refers to light having a wavelength of about 390 nm to about 700 nm.

As used herein, "ultraviolet (UV) ray" refers to a wavelength of greater than or equal to about 200 nm and less than about 390 nm.

As used herein, a photo-conversion efficiency (conversion efficiency, CE) refers to a percentage of the photoluminescence amount of the light dose which the quantum dot-polymer composite absorbs from the excitation light (e.g., blue light). The total light dose (B) of excitation light is obtained by integrating the photoluminescence (PL) spectrum of the excitation light, and the PL spectrum of the quantum dot-polymer composite is measured, and the light dose (A) of light in a green or red wavelength and the light dose (B') of light in a blue wavelength are obtained to provide a photo-conversion efficiency (CE) by the following equation:

$A/(B-B') \times 100 =$ photo-conversion efficiency (%).

As used herein, "dispersion" refers to a mixture wherein a dispersed phase is a solid and a continuous medium includes a liquid. For example, "dispersion" may refer to a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less, for example less than or equal to about 2 μm, or less than or equal to about 1 μm.

As used herein, "Group" may refer to a group of Periodic Table.

As used herein, "Group I" may refer to Group IA and Group IB, and examples may include Li, Na, K, Ru, or Cs but are not limited thereto.

As used herein, "Group II" may refer to Group IIA and Group IIB, and examples of the Group II metal may be Cd, Zn, Hg, and Mg, but are not limited thereto.

As used herein, "Group III" may refer to Group IIIA and Group IIIB, and examples of the Group III metal may be Al, In, Ga, and TI, but are not limited thereto.

As used herein, "Group IV" may refer to Group IVA and Group IVB, and examples of a Group IV metal may be Si, Ge, and Sn, but are not limited thereto. As used herein, "metal" may include a semi-metal such as Si.

As used herein, "Group V" may refer to Group VA, and examples thereof may include nitrogen, phosphorus, arsenic, antimony, and bismuth, but are not limited thereto.

As used herein, "Group VI" may refer to Group VIA, and examples thereof may include sulfur, selenium, and tellurium, but are not limited thereto.

Semiconductor nanocrystal particles also known as quantum dots are crystalline materials having a size of several nanometers. Such semiconductor nanocrystals particles may have a large surface area per a unit volume due to very small sizes and may exhibit different characteristics from bulk materials having the same composition due to a quantum confinement effect. Quantum dots may absorb light from an excitation source to be excited, and may emit energy corresponding to the energy bandgap of the quantum dots.

When quantum dots are colloid-synthesized, the particle sizes may be relatively freely controlled and also uniformly controlled. When quantum dots have sizes of less than or equal to about 10 nm, the quantum confinement effects in which the bandgaps further increase as the size decreases may become significant, thus the energy density may be enhanced. As quantum dots have a theoretical quantum efficiency (QY) of 100% and may emit light having a high color purity (e.g., full width at half maximum (FWHM) of less than or equal to about 40 nm), increased luminous efficiency and improved color reproducibility may be realized.

The quantum dots may be dispersed in a host matrix including a polymer, an inorganic material, or a combination thereof to form a composite in order to be applied to, e.g., used in, a device. A color filter including the quantum dot-polymer composite may provide a device having high luminance, a wide viewing angle, and high color reproducibility.

However, patterning the quantum dot-polymer composite has various technical limits unlike an absorption-type color filter. For example, in order to obtain the aforementioned effects, the composite may include quantum dots in an increased amount, for example, greater than or equal to about 10%, greater than or equal to about 11%, greater than or equal to about 12%, greater than or equal to about 13%, greater than or equal to about 15%, greater than or equal to about 16%, greater than or equal to about 17%, greater than or equal to about 18%, greater than or equal to about 19%, or greater than or equal to about 20%, based on a total weight solids, in a sufficiently dispersed state. In addition, for uniform and improved photoluminescence, the composite may include a scattering body in an amount of, for example, greater than or equal to about 5%, greater than or equal to about 6%, greater than or equal to about 7%, greater than or equal to about 8%, greater than or equal to about 9%, or greater than or equal to about 10%, based on a total weight of solids. The scattering body may uniformly spread the light emitted from the quantum dots that receive energy in, e.g., of, a certain wavelength to emit light. In addition, the scattering body may not react with the host material and may increase an absorption path length of excitation light in a host material so that the excitation light may well be absorbed by the quantum dots.

FIG. 1 is a schematic view showing that when light of a predetermined wavelength, that is, excitation light is radiated into a film-shaped quantum dot-polymer composite including the scattering body 1, the quantum dots 2 in the composite absorb the excitation light, are excited, and emit light of a specific wavelength, and the scattering body 1 scatters the excitation light, the light of the specific wavelength emitted from the quantum dots 2, or a combination thereof. In other words, the scattering body 1 in the composite plays a role of scattering the excitation light, so that the excitation light may be better absorbed in the quantum dots 2, and simultaneously, more uniformly scattering light emitted from the quantum dots 2 in the composite.

The increased amounts of the quantum dots and scattering body may reduce a dissolubility of the composite for a developing solution in a developing process to obtain a pattern. Reducing the dissolubility may make it difficult to form the quantum dot-polymer composite into a desirable pattern, and particularly, may cause difficulties in the mass-production of a pattern, for example filter clogging of a solution after the development. In addition, the quantum dots and the scattering body may exhibit limited or insufficient dispersibility with respect to a host matrix, particularly, a polymer matrix formed of an organic material, and accordingly, content of the quantum dots, the scattering body, or a combination thereof may not be unlimitedly increased.

The present inventors surprisingly found that a composition for manufacturing a quantum dot-polymer composite, which includes hollow metal oxide particulates as scattering bodies, may include the scattering bodies in a greater quantity due to a lower density than that of a composition that includes non-hollow metal oxide particulates when the scattering bodies have the same average size and are included in the same weight, e.g., weight percent, and accordingly, may have a higher photo-conversion efficiency (CE) than the composition including the non-hollow metal oxide particulates of the same average size in the same weight, e.g., weight percent.

Figure 2:
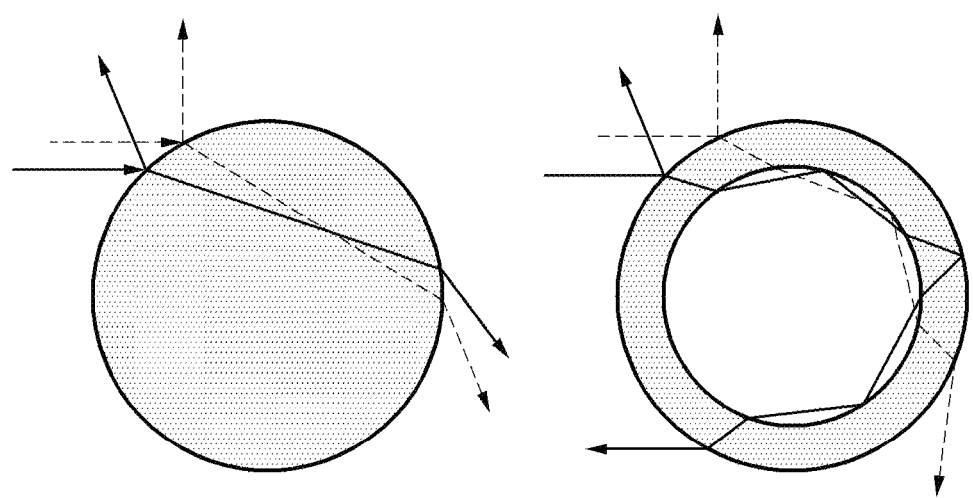
FIG. 2 is a schematic view showing how a non-hollow particulate-shaped scattering body (left) and a hollow scattering body (right) respectively can scatter light.

FIG. 2 is a schematic view showing that a hollow scattering body has improved scattering characteristics than a non-hollow particulate-shaped scattering body. As shown at the left of FIG. 2, as the non-hollow particulate-shaped scattering body has a predetermined refractive index, light radiated into the scattering body is curved and scattered with a little limited angle and aspect. On the contrary, as shown at the right of FIG. 2, light radiated into the hollow scattering body is scattered with various angles and aspects due to a difference between a refractive index of a metal oxide forming the scattering body and an internal refractive index of the hollow scattering body, and accordingly, the hollow scattering body exhibits improved scattering characteristics.

Accordingly, an embodiment provides a composition for manufacturing a quantum dot-polymer composite including quantum dots, dispersing agent for dispersing the quantum dots, a polymerizable monomer having a carbon-carbon double bond, an initiator, a solvent, and hollow metal oxide particulates as scattering bodies.

The hollow metal oxide particulates may include a titanium oxide, a silicon oxide, a barium oxide, a zinc oxide, a zirconium oxide, or a combination thereof, but is not limited thereto. The metal oxide may be a mixed metal oxide, for example a mixture of titanium and barium. As an example, the hollow metal oxide particulates may include $TiO_2$, $SiO_2$, $BaTiO_3$, $Ba_2TiO_4$, $ZnO$, $ZrO_2$, or a combination thereof, and in an embodiment, the hollow metal oxide particulates may be hollow silica ($SiO_2$), but is not limited thereto.

An average particle size of the hollow metal oxide particulates may be about 200 nm to about 500 nm, for example, about 210 nm to about 490 nm, about 220 nm to about 480 nm, about 230 nm to about 470 nm, about 240 nm to about 460 nm, about 250 nm to about 450 nm, about 260 nm to about 450 nm, about 270 nm to about 450 nm, about 280 nm to about 450 nm, about 290 nm to about 450 nm, about 300 nm to about 450 nm, about 300 nm to about 440 nm, about 300 nm to about 430 nm, about 300 nm to about 420 nm, about 300 nm to about 410 nm, or about 300 nm to about 400 nm, but is not limited thereto.

An average size of a hollow portion in the hollow metal oxide particulates may be greater than or equal to about 10 nm and less than about 500 nm. The average size of the hollow may be smaller than the size of the hollow metal oxide particulate, for example, greater than or equal to about 20 nm and less than or equal to about 490 nm, greater than or equal to about 30 nm and less than or equal to about 480 nm, greater than or equal to about 40 nm and less than or equal to about 470 nm, greater than or equal to about 50 nm and less than or equal to about 460 nm, greater than or equal to about 60 nm and less than or equal to about 450 nm, greater than or equal to about 70 nm and less than or equal to about 450 nm, greater than or equal to about 80 nm and less than or equal to about 450 nm, greater than or equal to about 90 nm and less than or equal to about 450 nm, greater than or equal to about 100 nm and less than or equal to about 450 nm, greater than or equal to about 110 nm and less than or equal to about 450 nm, greater than or equal to about 120 nm and less than or equal to about 450 nm, greater than or equal to about 130 nm and less than or equal to about 450 nm, greater than or equal to about 140 nm and less than or equal to about 450 nm, greater than or equal to about 150 nm and less than or equal to about 450 nm, greater than or equal to about 160 nm and less than or equal to about 450 nm, greater than or equal to about 170 nm and less than or equal to about 450 nm, greater than or equal to about 180 nm and less than or equal to about 450 nm, greater than or equal to about 190 nm and less than or equal to about 450 nm, greater than or equal to about 200 nm and less than or equal to about 450 nm, greater than or equal to about 210 nm and less than or equal to about 450 nm, greater than or equal to about 220 nm and less than or equal to about 450 nm, greater than or equal to about 230 nm and less than or equal to about 450 nm, greater than or equal to about 240 nm and less than or equal to about 450 nm, greater than or equal to about 250 nm and less than or equal to about 450 nm, greater than or equal to about 260 nm and less than or equal to about 450 nm, greater than or equal to about 270 nm and less than or equal to about 450 nm, greater than or equal to about 280 nm and less than or equal to about 450 nm, greater than or equal to about 290 nm and less than or equal to about 450 nm, greater than or equal to about 300 nm and less than or equal to about 450 nm, greater than or equal to about 300 nm and less than or equal to about 430 nm, or greater than or equal to about 300 nm and less than or equal to about 400 nm, but is not limited thereto.

The hollow metal oxide particulates may be, for example, present in the composition in an amount of greater than or equal to about 5 wt %, greater than or equal to about 6 wt %, greater than or equal to about 7 wt %, greater than or equal to about 8 wt %, greater than or equal to about 9 wt %, or greater than or equal to about 10 wt %, based on a total solid content of the composition. The hollow metal oxide particulates may be, for example, present in an amount of less than or equal to about 80 wt %, less than or equal to about 75 wt %, less than or equal to about 70 wt %, less than or equal to about 65 wt %, less than or equal to about 60 wt %, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 25 wt %, or less than or equal to about 20 wt %, based on a total solid content of the composition. When the hollow metal oxide particulates are present in the composition within the disclosed range, desired photoluminescence characteristics of a composite, for example, a desired refractive index of a composition or a quantum dot-polymer composite formed therefrom may be obtained, and in addition, incident light into the composition or the composite may more likely contact the quantum dots therein.

As described above, the hollow metal oxide particulates in the composition for a quantum dot-composite according to an embodiment are internally hollow and thus a greater number of hollow metal oxide particulates may be present than the non-hollow metal oxide particulates, when included at the same weight percent, for example, when the same weight of scattering bodies is present in the same volume of the quantum dot-composite.

Accordingly, the hollow metal oxide particulates have the same average particle diameter as that of the non-hollow metal oxide particulates but more hollow metal oxide particulates are included and may obtain a higher scattering effect, and thus, improved photo-conversion efficiency and maintenance percent compared to the non-hollow metal oxide particulates.

In the composition, the quantum dots (hereinafter, also referred to as semiconductor nanocrystals) may include a Group II-VI compound, a Group III-V compound, a Group IV-VI compound, a Group IV element or compound, a Group I-III-VI compound, a Group I-II-IV-VI compound, or a combination thereof.

The Group II-VI compound may be a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound such as ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof. A Group II-VI compound that further includes a Group III metal may be referred to as a Group II-III-VI compound.

The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, or a combination thereof; or a combination thereof. A Group III-V compound that further includes a Group II metal (e.g., InZnP) may be referred to as a Group II-III-V compound.

The Group IV-VI compound may be a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof. Examples of the Group I-III-VI compound may include $CuInSe_2$, $CuInS_2$, CuInGaSe, and CuInGaS, but are not limited thereto.

Examples of the Group I-II-IV-VI compound may include CuZnSnSe and CuZnSnS, but are not limited thereto.

The Group IV element or compound may include a single substance such as Si, Ge, or a combination thereof; a binary element compound such as SiC, SiGe, or a combination thereof; or a combination thereof.

The binary element compound, the ternary element compound, or the quaternary element compound may exist in a uniform concentration in a particle or in different concentrations within the same particle. The semiconductor nanocrystal may have a core/shell structure wherein a first semiconductor nanocrystal surrounds a second semiconductor nanocrystal. For example, the core and the shell may have an interface having a concentration gradient wherein the concentration of the element of the shell decreases toward the core. In addition, the semiconductor nanocrystal may have a structure including one semiconductor nanocrystal core and a multi-layered shell surrounding the core. In an embodiment, the shell may be a multi-layered shell having two or more layers, for example, 2, 3, 4, 5, or more layers. Each layer of the shell may have the same composition or different composition from each other. The adjacent layers may have different compositions from each other. The material of each layer may include a single composition or a combination of two types of materials (e.g., alloys). At least one element among materials of each layer may have a concentration changing along with a radial direction. For example, at least one layer may have a concentration gradient of a combination of the two types of materials. For example, at least one layer may include a gradient alloy. The layer including the combination of the two types of materials such as alloys may include a homogeneous composition (e.g., uniform alloy). The layer having a concentration gradient of a combination of the two types of materials (e.g., including a gradient alloy) may have a heterogeneous alloy composition and a composition changed in a radial direction.

The quantum dots may include a shell material and a core material having a different energy bandgap from each other. For example, the energy bandgap of the shell material may be larger than that of the core material. Alternatively, the energy bandgap of the shell material may be less than that of the core material. When the quantum dot has a multi-layered shell, the energy bandgap of the outer layer may be greater than the energy bandgap of the layer nearer to the core. Alternatively, in the multi-layered shell, the energy bandgap of the outer layer may be less than the energy bandgap of the layer nearer to the core. The quantum dots may control an absorption/photoluminescence wavelength by adjusting a composition and a size. A maximum photoluminescence peak wavelength of the quantum dots may be greater than or equal to about 460 nm, greater than or equal to about 490 nm, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, greater than or equal to about 610 nm, greater than or equal to about 620 nm, greater than or equal to about 630 nm, greater than or equal to about 640 nm, greater than or equal to about 650 nm, or greater than or equal to about 700 nm. The maximum photoluminescence peak wavelength of the quantum dots may be less than or equal to about 750 nm, less than or equal to about 730 nm, less than or equal to about 720 nm, less than or equal to about 710 nm, less than or equal to about 700 nm, less than or equal to about 690 nm, less than or equal to about 680 nm, less than or equal to about 670 nm, less than or equal to about 660 nm, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, less than or equal to about 540 nm, less than or equal to about 530 nm, less than or equal to about 520 nm, less than or equal to about 510 nm, or less than or equal to about 500 nm.

The quantum dots may have quantum efficiency (QE) of greater than or equal to about 10%, for example, greater than or equal to about 20%, greater than or equal to about 30%, greater than or equal to about 50%, greater than or equal to about 60%, greater than or equal to about 70%, greater than or equal to about 90%, or about 100%. The quantum dots may have a relatively narrow spectrum so as to improve color purity or color reproducibility. The quantum dots may have, for example, a full width at half maximum (FWHM) of a photoluminescence wavelength spectrum of less than or equal to about 50 nm, less than or equal to about 45 nm, less than or equal to about 40 nm, or less than or equal to about 30 nm.

The quantum dot may have a particle size, for example, a diameter or the largest linear length crossing the particle of greater than or equal to about 1 nm and less than or equal to about 100 nm. The quantum dot may have a particle size of about 1 nm to about 50 nm. The quantum dot may have a size, for example, greater than or equal to about 2 nm, greater than or equal to about 3 nm, or greater than or equal to about 4 nm. The quantum dot may have a size, for example, less than or equal to about 50 nm, less than or equal to about 40 nm, less than or equal to about 30 nm, less than or equal to about 20 nm, or less than or equal to about 15 nm. The shape of the quantum dots is not particularly limited. For example, the shapes of the quantum dots may be a sphere, an oval, a polyhedron, a pyramid, a multipod, a square, a rectangular parallelepiped, a nanotube, a nanorod, a nanowire, a nanosheet, or a combination thereof, but is not limited thereto.

The quantum dots may be commercially available or may be appropriately synthesized. When quantum dots are colloid-synthesized, the particle size may be relatively freely, and also uniformly controlled. When quantum dots have a size of less than or equal to about 10 nm, the quantum confinement effects in which the bandgap further increases as a size becomes smaller may become significant, and thus the energy density may be enhanced. In a colloid synthesis, precursor materials are reacted in an organic solvent to grow crystal particles, and the organic solvent or a ligand compound may coordinate on, e.g., be bound to, the surface of the quantum dot, controlling the growth of the particle. Specific types of the organic solvent and the ligand compound are known. Excess organic materials, for example, organic solvent/ligand, etc. that are not coordinated on, e.g., bound to, the surface of the quantum dots after synthesis may be removed by reprecipitation using an excess amount of a non-solvent. Examples of the non-solvent may be acetone, ethanol, methanol, and the like, but are not limited thereto.

The quantum dots may include an organic ligand having a hydrophobic moiety and not having a photopolymerizable moiety. The organic ligand moiety may be bound to a surface of the quantum dot. The organic ligand may include $RCOOH$, $RNH_2$, $R_2NH$, $R_3N$, $RSH$, $R_3PO$, $R_3P$, $ROH$, $RCOOR'$, $RPO(OH)_2$, $R_2POOH$ (wherein, R and R' are independently a C1 to C24 substituted or unsubstituted aliphatic hydrocarbon group such as a C3 to C24 alkyl or alkenyl group, a C6 to C20 substituted or unsubstituted aromatic hydrocarbon group such as a C6 to C20 aryl group), or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine compounds such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributylamine, or trioctylamine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octyl phosphine, dioctyl phosphine, tributyl phosphine, diphenyl phosphine, triphenyl phosphine, or trioctyl phosphine; a phosphine oxide compound such as methyl phosphine oxide, ethyl phosphine oxide, propyl phosphine oxide, butyl phosphine oxide pentyl phosphine oxide, tributyl phosphine oxide, octyl phosphine oxide, dioctyl phosphine oxide, diphenyl phosphine oxide, triphenyl phosphine oxide, or trioctylphosphine oxide; a C5 to C20 alkyl phosphinic acid such as hexylphosphinic acid, octylphosphinic acid, dodecanephosphinic acid, tetradecanephosphinic acid, hexadecanephosphinic acid, or octadecanephosphinic acid; an alkylphosphonic acid such as a C5 to C20 alkylphosphonic acid; and the like, but are not limited thereto. The quantum dots may include a hydrophobic organic ligand that is the same, or a mixture of at least two different hydrophobic organic ligands. The hydrophobic organic ligand may not include a photopolymerizable moiety, for example, an acrylate group, a methacrylate group, and the like.

An amount of the quantum dots may be greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, greater than or equal to about 20 wt %, greater than or equal to about 21 wt %, greater than or equal to about 22 wt %, greater than or equal to about 23 wt %, greater than or equal to about 24 wt %, or greater than or equal to about 25 wt %, based on a total weight of solids in the composition. The amount of the quantum dots may be less than or equal to about 70 wt %, less than or equal to about for example, 65 wt %, less than or equal to about 60 wt %, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, less than or equal to about 19 wt %, less than or equal to about 17 wt %, or less than or equal to about 15 wt %, based on a total weight of solids in the composition.

When the quantum dots are simply mixed with a polymer, for example, an alkali developable photoresist, or a photocurable thermosetting polymer without surface treatment, significant aggregation of the quantum dots may occur. In order to apply a patterned quantum dot-polymer composite to a color filter, a large amount of quantum dots may be included in the composite, and patterns may be difficult to form by non-uniform dispersion of the quantum dot. In the composition according to an embodiment, for example, the quantum dots including an organic ligand having a hydrophobic moiety on surfaces of the quantum dots may be dispersed in a dispersing agent, for example, a polymer solution including a carboxyl group to obtain quantum dot-polymer dispersion, and then mixed with a photocurable, or thermally curable other components, for example, a polymerizable (e.g., photopolymerizable or thermally polymerizable) monomer having a carbon-carbon double bond, an initiator (e.g., photoinitiator or thermal initiator), a hollow metal oxide particulate, and a solvent, for example, an organic solvent. Thereby, in the composition according to an embodiment, the quantum dots, for example, a relatively large amount of the quantum dots may be well dispersed in a photo- or thermally-curable polymer without significant aggregation.

The composition according to an embodiment may be used to provide a pattern of a quantum dot-polymer composite. The composition according to an embodiment may be a quantum dot-containing photoresist composition to which a photolithography method may be applied. The composition according to an embodiment may be an ink composition that may provide a pattern by printing, for example, a droplet discharge method, such as, inkjet printing. The composition according to an embodiment may not include a conjugated polymer except for a cardo binder resin that will be described below. The composition according to an embodiment may include a conjugated polymer. Herein, the term "conjugated polymer" may refer to a polymer having a conjugated double bond in a main chain of the polymer, for example, a polyphenylenevinylene.

In an embodiment, the carboxyl group-containing polymer may be an insulating polymer. The carboxyl group-containing polymer may include a copolymer of a monomer mixture including a first monomer including a carboxyl group and a carbon-carbon double bond, and a second monomer including a carbon-carbon double bond and a hydrophobic moiety and not including a carboxyl group, and optionally a third monomer including a carbon-carbon double bond and a hydrophilic moiety and not including a carboxyl group;

a multiple aromatic ring-containing polymer having a backbone structure in which two aromatic rings are bound to a quaternary carbon atom that is a constituent atom of another cyclic moiety in the backbone, and including a carboxyl group (a cardo binder resin as further described below); or a combination thereof.

Specific examples of the first monomer may include unsaturated carboxylic acid and vinyl carboxylic acid ester compounds such as acrylic acid, methacrylic acid, maleic acid, itaconic acid, fumaric acid, 3-butenoic acid, vinyl acetate, or vinyl benzoate, but are not limited thereto. One or at least two different first monomers may be used.

Specific examples of the second monomer may be an alkenyl aromatic compound such as styrene, alpha-methyl styrene, vinyl toluene, or vinyl benzyl methyl ether; an unsaturated carboxylic acid ester compound such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; an unsaturated carboxylic acid amino alkyl ester compound such as 2-amino ethyl acrylate, 2-amino ethyl methacrylate, 2-dimethyl amino ethyl acrylate, or 2-dimethyl amino ethyl methacrylate; maleimides such as N-phenylmaleimide, N-benzylmaleimide, or N—(C1 to C12 alkyl)maleimide; an unsaturated carboxylic acid glycidyl ester compound such as glycidyl acrylate, or glycidyl methacrylate; a vinyl cyanide compound such as acrylonitrile or methacrylonitrile; an unsaturated amide compound such as acrylamide or methacrylamide, but are not limited thereto. One or at least two different second monomers may be used.

Specific examples of the third monomer may include 2-hydroxyethyl acrylate, 2-hydroxyethyl methacrylate, 2-hydroxybutyl acrylate, or 2-hydroxybutyl methacrylate, but are not limited thereto. One or at least two different third monomers may be used.

When the carboxyl group-containing polymer is a copolymer of a mixture including the first monomer, the second monomer, and optionally the third monomer, in the copolymer an amount of a first repeating unit derived from the first monomer may be greater than or equal to about 10 mole percent (mol %), for example, greater than or equal to about 15 mol %, greater than or equal to about 25 mol %, or greater than or equal to about 35 mol %, and the amount of the first repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the carboxyl group-containing polymer, an amount of a second repeating unit derived from the second monomer may be greater than or equal to about 10 mol %, for example, greater than or equal to about 15 mol %, greater than or equal to about 25 mol %, or greater than or equal to about 35 mol % and the amount of the second repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %, if present.

In the carboxyl group-containing polymer, an amount of a third repeating unit derived from the third monomer, if present, may be greater than or equal to about 1 mol %, for example, greater than or equal to about 5 mol %, greater than or equal to about 10 mol %, or greater than or equal to about 15 mol % and the amount of the third repeating unit may be less than or equal to about 30 mol %, less than or equal to about for example, 25 mol %, less than or equal to about 20 mol %, less than or equal to about 18 mol %, less than or equal to about 15 mol %, or less than or equal to about 10 mol %.

The carboxyl group-containing polymer may be a copolymer of (meth)acrylic acid; and at least one second/third monomer that is an aryl or alkyl (meth)acrylate, a hydroxyalkyl (meth)acrylate, or styrene. For example, the carboxyl group-containing polymer may be a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxyethyl methacrylate copolymer, or a methacrylic acid/benzyl methacrylate/styrene/2-hydroxyethyl methacrylate copolymer.

The carboxyl group-containing polymer may include a multiple aromatic ring-containing polymer, in particular a multiple aromatic ring-containing polymer including a backbone structure in which two aromatic rings are bound to a quaternary carbon atom that is a constituent atom of another cyclic moiety in the main chain and including a carboxyl group. The multiple aromatic ring-containing polymer is known as a "cardo binder resin" and may commercially available. A variety of cardo binder resins are described, for example, in U.S. Pat. No. 8,530,537, which is incorporated herein by reference in its entirety.

The carboxyl group-containing polymer may have an acid value of greater than or equal to about 50 mg KOH/g. For example, the carboxyl group-containing polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the carboxyl group-containing polymer may be for example, less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto.

The carboxyl group-containing polymer may have a weight average molecular weight of greater than or equal to about 1,000 grams per mole (g/mol), for example, greater than or equal to about 2,000 g/mol, greater than or equal to about 3,000 g/mol, or greater than or equal to about 5,000 g/mol. The carboxyl group-containing polymer may have a weight average molecular weight of less than or equal to about 100,000 g/mol, or less than or equal to about 50,000 g/mol.

In the composition, an amount of the carboxyl group-containing polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight of the composition, but is not limited thereto. The amount of the carboxyl group-containing polymer may be less than or equal to about 35 wt %, for example less than or equal to about 33 wt %, less than or equal to about 30 wt %, based on a total weight of the composition. Within the ranges, the carboxyl group-containing polymer may ensure dispersibility of the quantum dot. In an embodiment, the amount of the carboxyl group-containing polymer may be about 0.5 wt % to about 55 wt %, based on a total weight of solids in the composition.

In the composition, the polymerizable (e.g., photopolymerizable) monomer including the carbon-carbon double bond may include an (e.g., photopolymerizable) (meth) acryl-based monomer. The monomer may be a precursor for an electronically insulating polymer. The acryl-based monomer may include a (C1 to C18 alkyl) (meth)acrylate such as ethylene glycol di(meth)acrylate, triethylene glycol di(meth) acrylate, diethylene glycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tri(meth)acrylate, pentaerythritol tetra (meth) acrylate, dipentaerythritol di(meth)acrylate, dipentaerythritol tri(meth)acrylate, dipentaerythritol penta(meth)acrylate, pentaerythritol hexa(meth)acrylate, bisphenol A di(meth) acrylate, bisphenol A epoxy acrylate, trimethylolpropane tri(meth)acrylate, ethylene glycol monomethyl ether (meth) acrylate, novolac epoxy (meth)acrylate, diethylene glycol di(meth)acrylate, triethylene glycol di(meth)acrylate, propylene glycol di(meth)acrylate, tris(meth)acryloyloxyethyl phosphate, or a combination thereof.

An amount of the monomer may be greater than or equal to about 0.5 wt %, for example, greater than or equal to about 1 wt %, or greater than or equal to about 2 wt %, based on a total weight of the composition. The amount of the photopolymerizable monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight of the composition.

The initiator in the composition may be used for polymerization of the aforementioned monomers. The initiator is a compound accelerating a radical reaction (e.g., radical polymerization of monomer) by producing radical chemical species under a mild condition (e.g., by heat or light). The initiator may be a thermal initiator or a photoinitiator. Examples of the thermal initiator may be azobisisobutyronitrile, benzoyl peroxide, and the like, but are not limited thereto. The photoinitiator is a compound capable of initiating a radical polymerization of the aforementioned photopolymerizable acrylic monomer, a thiol compound (which will be described later), or a combination thereof by light. The type of the photoinitiator is not particularly limited. The photoinitiator may include a triazine-based compound, an acetophenone compound, a benzophenone compound, a thioxanthone compound, a benzoin compound, an oxime ester compound, an aminoketone compound, a phosphine or phosphine oxide compound, a carbazole-based compound, a diketone compound, a sulfonium borate-based compound, a diazo-based compound, a biimidazole-based compound, or a combination thereof, but is not limited thereto. Each of the aforementioned initiators is known, but is not particularly limited.

In the composition, an amount of the initiator may be appropriately adjusted considering types and amounts of the used photopolymerizable monomer. In an embodiment, an amount of the initiator may be about 0.01 wt % to about 10 wt %, based on a total weight of the composition, but is not limited thereto.

The composition may further include a (multiple or mono-functional) thiol compound having at least one thiol group at a terminal end of the (multiple or mono-functional) thiol compound.

The thiol compound may be a dithiol compound, a trithiol compound, a tetrathiol compound, or a combination thereof. For example, the thiol compound may be glycol di-3-mercaptopropionate, glycol dimercaptoacetate (e.g., ethylene glycol dimercaptoacetate), trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, a polyethylene glycol dithiol including 1 to 10 ethylene glycol repeating units, or a combination thereof.

In an embodiment, the thiol compound may be represented by Chemical Formula 1:

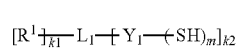

Chemical Formula 1

In Chemical Formula 1, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R' are independently hydrogen or a C1 to C30 linear or branched alkyl group and are not simultaneously hydrogen); an isocyanate group (—R-M=C=O, wherein R is a substituted or unsubstituted C1 to C20 alkylene group and M is an organic or inorganic cation); a halogen; —ROR' (wherein R is a substituted or unsubstituted C1 to C20 alkylene group and R' is hydrogen or a C1 to C20 linear or branched alkyl group); an acyl halide (—RC(=O)X, wherein R is a substituted or unsubstituted alkylene group and X is a halogen); —C(=O) OR' (wherein R' is hydrogen or a C1 to C20 linear or branched alkyl group); —CN; —C(=O)ORR' or —C(=O) ONRR' (wherein R and R' are independently hydrogen or a C1 to C20 linear or branched alkyl group), $L_1$ is a carbon atom, a substituted or unsubstituted C1 to C30 alkylene group, a substituted or unsubstituted C1 to C30 alkylene group wherein at least one methylene moiety (—$CH_2$—) is replaced by a sulfonyl moiety (—$SO_2$—), a carbonyl moiety (CO), —O—, —S—, —SO—, —C(=O) O—, —C(=O)NR— (wherein R is hydrogen or a C1 to C10 alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene moiety, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene moiety (—$CH_2$—) is replaced by a sulfonyl moiety (—S (=O)$_2$—), a carbonyl moiety (—C(=O)—), —O—, —S—, —S(=O)—, —C(=O)O—, —C(=O)NR— (wherein R is hydrogen or a C1 to C10 linear or branched alkyl group), —NR— (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of $Y_1$ and the sum of k1 and k2 does not exceed the valence of $L_1$.

An amount of the thiol compound may be less than or equal to about 10 wt %, for example, less than or equal to about 9 wt %, less than or equal to about 8 wt %, less than or equal to about 7 wt %, less than or equal to about 6 wt %, or less than or equal to about 5 wt %, based on a total weight of the composition. The amount of the thiol compound may be greater than or equal to about 0.1 wt %, for example, greater than or equal to about 0.5 wt % or greater than or equal to about 1 wt %, based on a total weight of the composition.

The solvent may be an organic solvent (or a liquid vehicle) and types of usable organic solvents are not particularly limited. Types and amounts of the organic solvent may be appropriately determined by considering the aforementioned main components, that is the quantum dot, the dispersing agent, polymerizable monomer, the initiator, the scattering body that is the hollow metal particulate oxide, the thiol compound if used, and types and amounts of an additive which is described later. The composition may include a solvent in a residual amount except for a desired amount of the (non-volatile) solid. Examples of the solvent (or liquid vehicle) may include ethylene glycols such as ethyl 3-ethoxy propionate, ethylene glycol, diethylene glycol, or polyethylene glycol; glycol ethers such as ethylene glycol monomethyl ether, ethylene glycol monoethyl ether, diethylene glycol monomethyl ether, ethylene glycol diethyl ether, or diethylene glycol dimethyl ether; glycol ether acetates such as ethylene glycol acetate, ethylene glycol monoethyl ether acetate, diethylene glycol monoethyl ether acetate, or diethylene glycol monobutyl ether acetate; propylene glycols such as propylene glycol; propylene glycol ethers such as propylene glycol monomethyl ether, propylene glycol monoethyl ether, propylene glycol monopropyl ether, propylene monobutyl ether, propylene glycol dimethylether, dipropylene glycol dimethyl ether, propylene glycol diethyl ether, or dipropylene glycol diethyl ether; propylene glycol ether acetates such as propylene glycol monomethyl ether acetate, or dipropylene glycol monoethyl ether acetate; amides such as N-methylpyrrolidone, dimethyl formamide, or dimethyl acetamide; ketones such as methylethylketone (MEK), methylisobutylketone (MIBK), or cyclohexanone; petroleums such as toluene, xylene, or solvent naphtha; esters such as ethyl acetate, butyl acetate, or ethyl lactate; ethers such as diethyl ether, dipropyl ether, or dibutyl ether; aliphatic, alicyclic, or aromatic hydrocarbons; or carboxylate/ester derivatives (e.g., cyclohexyl acetates), and mixtures thereof.

If desired, the composition may further include various additives, such as a leveling agent, a coupling agent, or a combination thereof in addition to the aforementioned components. The amount of the additive is not particularly limited, and may be controlled within an appropriate range wherein the additive does not cause an adverse effect on preparation of the composition and production of the quantum dot-polymer composite and optionally a patterning of the composite. The aforementioned additives may be known compounds or materials having desirable functions and are not particularly limited.

If used, an amount of the additives may be greater than or equal to about 0.1 wt %, for example, greater than or equal to about 0.5 wt %, greater than or equal to about 1 wt %, greater than or equal to about 2 wt %, or greater than or equal to about 5 wt %, based on a total weight of the composition, but is not limited thereto. If used, the amount of the additives may be less than or equal to about 20 wt %, for example less than or equal to about 19 wt %, less than or equal to about 18 wt %, less than or equal to about 17 wt %, less than or equal to about 16 wt %, or less than or equal to about 15 wt %, based on a total weight of the composition, but is not limited thereto.

The composition may be manufactured by mixing the above components appropriately. In an embodiment, the quantum dots and the scattering body (as inorganic materials) may not be well-dispersed in the solvent (as an organic material), and thus, in order to obtain uniform dispersion, each of or both of the quantum dots and the scattering body may be predispersed in the dispersing agent for dispersing the quantum dots, and then may be mixed in the solvent.

An embodiment provides a quantum dot-polymer composite obtained by curing the composition according to an embodiment.

The quantum dot-polymer composite includes a polymer matrix and quantum dots dispersed in the polymer matrix, and the aforementioned hollow metal particulate oxide.

The polymer matrix may include the aforementioned dispersing agent and a polymerization product of the aforementioned polymerizable monomer having the carbon-carbon double bond by the aforementioned initiator (thermal initiator or photoinitiator) in the composition according to an embodiment. In an embodiment, when the composition according to an embodiment further includes the aforementioned thiol compound having at least one thiol group at a terminal end of the thiol compound, the polymer matrix may further include a thiolene resin. The polymer matrix may include the dispersing agent, the polymerization product of the polymerizable monomer having the carbon-carbon double bond, a cross-linked polymer formed by cross-linking the thiolene resin, or a combination thereof. In an embodiment, the thiol compound having at least one thiol group at a terminal end of the thiol compound may be a multiple thiol compound having at least two thiol groups at a terminal end of the thiol compound, and in this case, the polymer matrix may include a polymerization product between the multiple thiol compounds. The polymer matrix may not include a conjugated polymer (except for a cardo binder resin).

The quantum dot-polymer composite may be in the form of a film. The film may have for example a thickness of less than or equal to about 30 µm, for example, less than or equal to about 10 µm, less than or equal to about 8 µm, or less than or equal to about 7 µm and greater than about 2 µm, for example, greater than or equal to about 3 µm, greater than or equal to about 3.5 µm, or greater than or equal to about 4 µm. The quantum dot-polymer composite includes the hollow metal oxide particulates as scattering bodies and thus may include more scattering bodies than a quantum dot-polymer composite including non-hollow metal oxide particulates, and thereby may exhibit an improved photo-conversion efficiency and maintenance percent.

An embodiment provides a display device including a light source and a photoluminescent element, wherein the photoluminescent element includes the quantum dot-polymer composite according to an embodiment, and the light source is configured to provide the photoluminescent element with incident light.

The incident light may have a photoluminescence peak wavelength of greater than or equal to about 440 nm, for example, greater than or equal to about 450 nm and less than or equal to about 460 nm.

The photoluminescent element may include a sheet including, e.g., of, the quantum dot-polymer composite. In an embodiment, the display device may further include a liquid crystal panel. The sheet including, e.g., of the quantum dot-polymer composite may be disposed between the light source and the liquid crystal panel. FIG. 3 is an exploded view of a non-limiting display device.

Figure 3A:
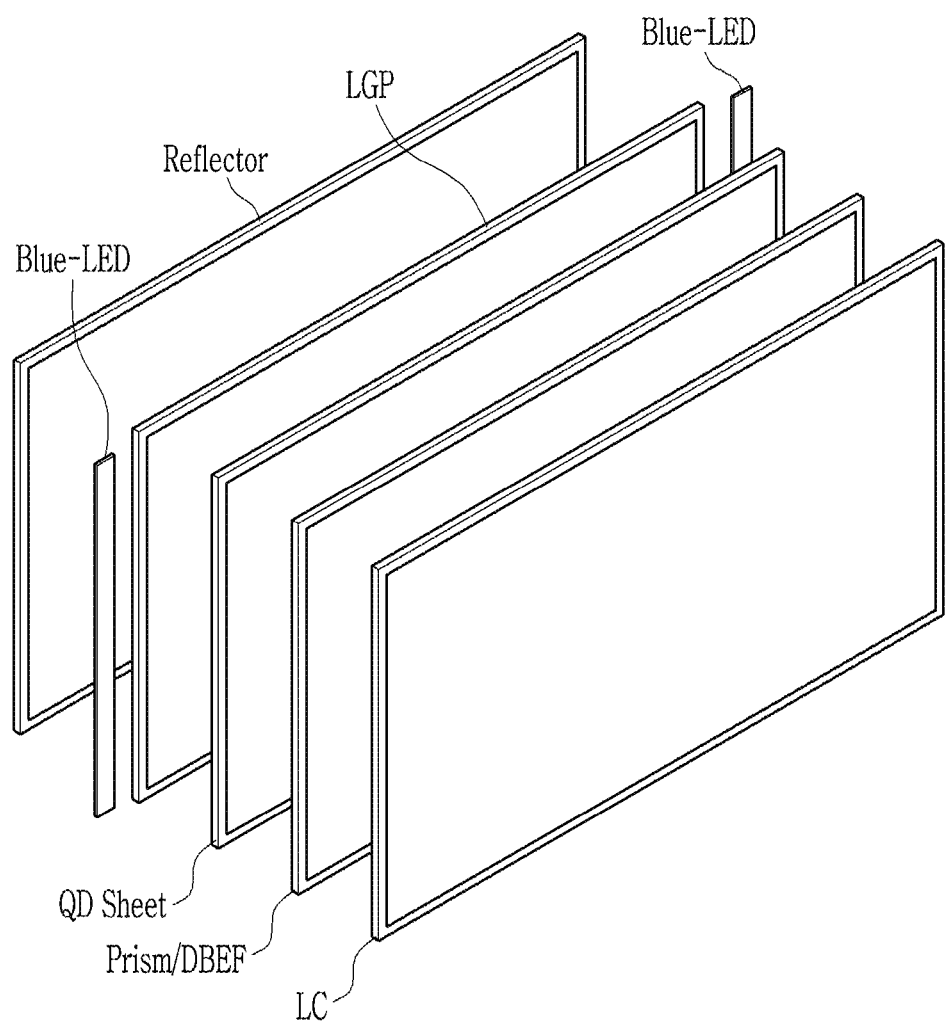
FIG. 3A is an exploded view showing a display device according to an embodiment.

Referring to FIG. 3A, the display device may have a structure wherein a reflector, a light guide panel (LGP) and a blue LED light source (Blue-LED), the aforementioned quantum dot (QD)-polymer composite sheet (QD sheet), and, for example, various optical films, such as, a prism, a double brightness enhance film (DBEF), and the like, are stacked and a liquid crystal panel is disposed thereon.

Figure 3B:
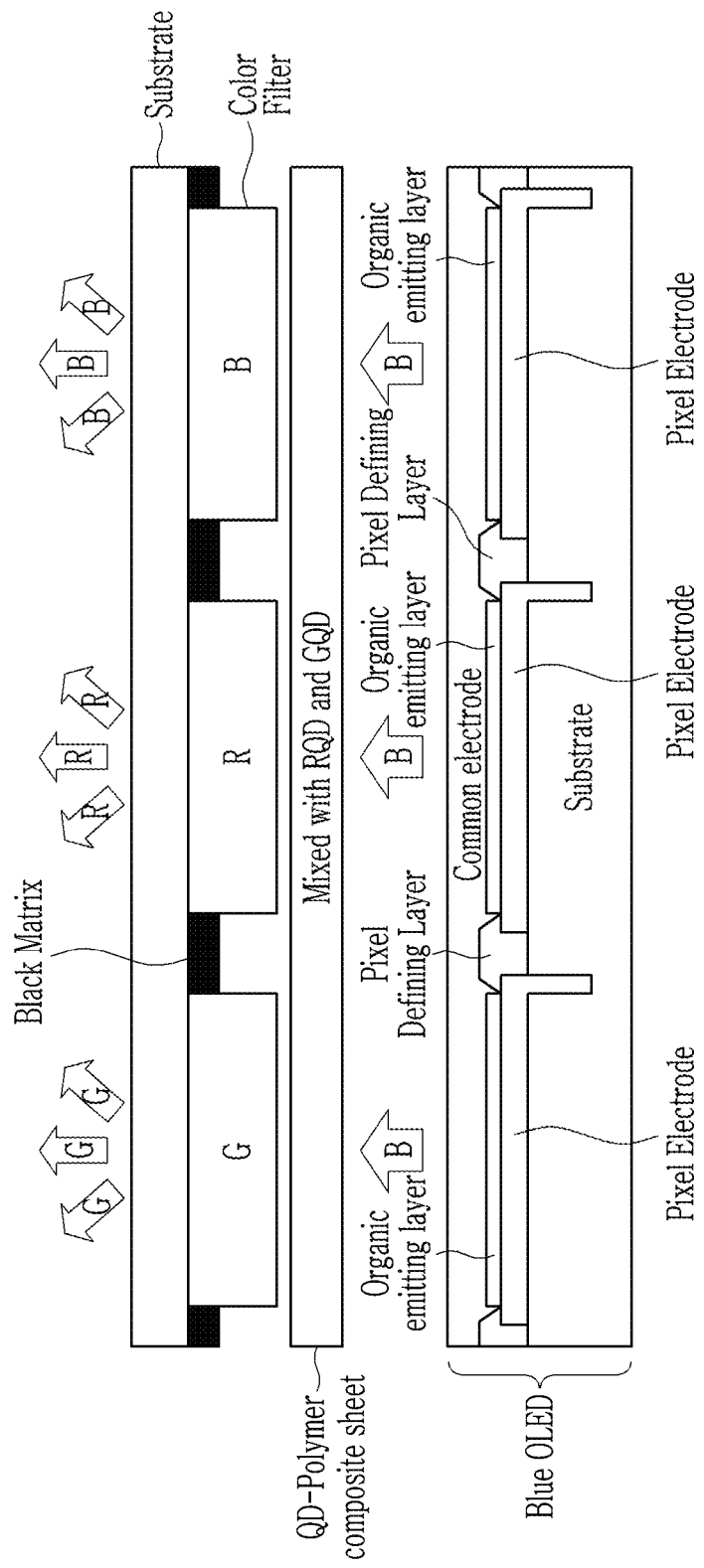
FIG. 3B is a cross-sectional view showing a display device according to an embodiment.

The display device may not include a liquid crystal layer. The display device may include a blue organic light emitting diode (OLED) as a light source. Referring to FIG. 3B, the display device may include a (blue) organic light emitting diode (OLED) as a light source and a quantum dot-polymer composite sheet including a mixture of red and green quantum dots thereon. On the quantum dot-polymer composite sheet, an absorption-type color filter layer (having R/G/B sections) and a substrate may be disposed.

The organic light emitting diode (OLED) may include at least two pixel electrodes formed on the substrate, a pixel define layer formed between the adjacent pixel electrodes, and an organic emission layer formed on each pixel electrode, and a common electrode layer formed on the organic emission layer.

The substrate may include an insulating material and may have flexibility. Details for the substrate are described hereinafter.

A line layer including a thin film transistor or the like is formed on the substrate. The line layer may further include a gate line, a sustain voltage line, a gate insulating layer, a data line, a source electrode, a drain electrode, a semiconductor, a protective layer, and the like. The detail structure of the line layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described later.

The pixel electrode may function as an anode of the display device. The pixel electrode may be formed of a transparent conductive material such as indium tin oxide (ITO) or indium zinc oxide (IZO). The pixel electrode may be formed of a material having a light-blocking properties such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure in which the aforementioned transparent conductive material and the aforementioned material having light-blocking properties are stacked sequentially.

Between two adjacent pixel electrodes, a pixel define layer (PDL) overlapped with a terminal end of the pixel electrode to divide the pixel electrode into a pixel unit. The pixel define layer is an insulation layer which may electrically block the at least two pixel electrodes.

The pixel define layer covers a portion of the upper surface of the pixel electrode, and the remaining region of the pixel electrode not covered by the pixel define layer may provide an opening. An organic emission layer that will be described later may be formed on the region defined by the opening.

The organic emission layer defines each pixel area by the aforementioned pixel electrode and pixel define layer. In other words, one pixel area may be defined as an area where is formed with one organic emission unit layer which is contacted with one pixel electrode divided by the pixel define layer.

For example, in the display device according to an embodiment, the organic emission layer may be defined as a first pixel area, a second pixel area and a third pixel area, and each pixel area is spaced apart from each other leaving a predetermined interval by the pixel define layer.

In an embodiment, the organic emission layer may emit a third light belonging to a visible light region or to a UV region. That is, each of the first to the third pixel areas of the organic emission layer may emit a third light. In an embodiment, the third light may be a light having the highest energy in the visible light region, for example, may be blue light. When all pixel areas of the organic emission layer are designed to emit the same light, e.g., light of the same color, each pixel area of the organic emission layer may be all formed of the same or similar materials or may exhibit the same or similar properties. Accordingly, a process difficulty of forming the organic emission layer may be relieved, and the display device may be applied for, e.g., used in, a large scale/large area process. However, the organic emission layer according to an embodiment is not necessarily limited thereto, but the organic emission layer may be designed to emit at least two different lights, e.g., at least two different colored lights.

The organic emission layer includes an organic emission unit layer in each pixel area, and each organic emission unit layer may further include an auxiliary layer (e.g., hole injection layer (HIL), hole transport layer (HTL), electron transport layer (ETL), etc.) besides the emission layer.

The common electrode may function as a cathode of the display device. The common electrode may be formed of a transparent conductive material such as indium tin oxide (ITO) or indium zinc oxide (IZO). The common electrode may be formed on the organic emission layer and may be integrated therewith.

A planarization layer or a passivation layer may be formed on the common electrode. The planarization layer may include a (e.g., transparent) insulating material for ensuring electrical insulation with the common electrode.

The absorption-type color filter layer may be formed corresponding to each pixel area. The absorption-type color filter layer may include a G section configured to selectively transmit green light and to absorb and block light in the other wavelength region, a R section configured to selectively transmit red light and to absorb and block light in the other wavelength region, and a B section configured to selectively transmit blue light and to absorb green light and red light.

In an embodiment, the display device may include a light source and a photoluminescent element including a photoluminescent layer, wherein the light source is configured to provide the photoluminescent layer with light and the photoluminescent layer may include a pattern of the aforementioned quantum dot-polymer composite.

The photoluminescent layer may be included in the display device as a stack structure disposed on the substrate.

The photoluminescent layer may include a pattern of the quantum dot-polymer composite and the pattern may include at least one repeating section emitting light in a predetermined wavelength.

In an embodiment, the pattern of the quantum dot-polymer composite may include a first section configured to emit a first light, a second section configured to emit a second light, or a combination thereof.

The first light and the second light may have different maximum photoluminescence wavelengths in photoluminescence spectra. In an embodiment, the first light may be red light having a maximum photoluminescence wavelength of about 600 nm to about 650 nm (e.g., about 620 nm to about 650 nm) and the second light may be green light having a maximum photoluminescence wavelength of about 500 nm to about 550 nm (e.g., about 510 nm to about 550 nm). The pattern of the quantum dot-polymer composite may further include a third section configured to emit or transmit a third light (e.g., blue light) that is different from the first light and the second light. A maximum peak wavelength of the third light may be greater than or equal to about 380 nm, for example, greater than or equal to about 420 nm, greater than or equal to about 430 nm, greater than or equal to about 440 nm, or greater than or equal to about 445 nm and less than or equal to about 480 nm, for example, less than or equal to about 470 nm, less than or equal to about 460 nm, or less than or equal to about 455 nm. The light source may emit the third light.

In the patterned film of the quantum dot-polymer composite in a display device according to an embodiment, the first section may be a red light emitting section, the second section may be a green light emitting section, and the light source may be an element emitting blue light. In this case, an optical element to block (e.g., reflects or absorbs) blue light may be disposed on the front surface (light emitting surface) of the first section and the second section The substrate may be a substrate including an insulating material. The substrate may include glass; various polymers such as polyesters (e.g., polyethylene terephthalate (PET) or polyethylene naphthalate (PEN)), polycarbonate, polyacrylate, and the like; inorganic materials such as polysiloxane (e.g., polydimethylsiloxane (PDMS)); $Al_2O_3$, ZnO, and the like; or a combination thereof, but is not limited thereto. A thickness of the substrate may be appropriately selected considering a substrate material, but is not particularly limited. The substrate may have flexibility. The substrate may be configured to have a transmittance of greater than or equal to about 50%, greater than or equal to about 60%, greater than or equal to about 70%, greater than or equal to about 80%, or greater than or equal to about 90% for light emitted from the quantum dot.

In an embodiment, the aforementioned stack structure may be manufactured using a photoresist (PR) composition. Such a method may include forming a film of the aforementioned composition on a substrate;

exposing a selected region of the film to light (e.g., a wavelength of less than or equal to about 400 nm); and developing the exposed film with an alkali developing solution to obtain a pattern of the quantum dot-polymer composite.

The substrate and the composition have the same specification as described above. Non-limiting methods of forming the pattern are illustrated, referring to FIG. 4.

The aforementioned composition is coated to have a predetermined thickness on a substrate in an appropriate method of spin coating, slit coating, and the like. The formed film may be, optionally, pre-baked (PRB). The pre-baking may be performed by selecting an appropriate condition from conditions of a temperature, time, an atmosphere, and the like.

The formed (or optionally pre-baked) film is exposed (EXP) to light having a predetermined wavelength under a mask having a predetermined pattern. A wavelength and intensity of the light may be selected considering types and amounts of the photoinitiator, types and amounts of the quantum dots, and the like.

The exposed film is treated with an alkali developing solution (e.g., by dipping or spraying) to dissolve an unexposed region and obtain a desired pattern. The obtained pattern may be, optionally, post-baked (POB) to improve crack resistance and solvent resistance of the pattern, for example, at about 150° C. to about 230° C. for a predetermined time (e.g., greater than or equal to about 10 minutes or greater than or equal to about 20 minutes).

When the quantum dot-polymer composite pattern has a plurality of repetitive sections, a quantum dot-polymer composite having a desired pattern may be obtained by preparing a plurality of compositions including quantum dots having desired photoluminescence properties (a photoluminescence peak wavelength and the like) to form each repetitive section (e.g., a red light emitting quantum dot, a green quantum dot, or optionally, a blue quantum dot) and repeating the aforementioned formation processes of the pattern regarding each composition a number of times (e.g., twice or more or three times or more).

For example, the quantum dot-polymer composite may have a pattern of at least two repetitive color sections (e.g., RGB sections). This quantum dot-polymer composite pattern may be used as a photoluminescence-type color filter (C/F) in a display device.

In an embodiment, the aforementioned stack structure may be manufactured using an ink composition. Such a method may include depositing the ink composition on a desired substrate or an organic light emitting diode that will be described later (e.g., blue light emitting OLED) (e.g., so as to have a desired pattern) by using an appropriate system (e.g., a droplet discharging apparatus, such as an inkjet or a nozzle printing device), and performing removal of a solvent by heating the same and polymerization. By such a method, a highly precise quantum dot-polymer composite film or pattern may be formed in a simple manner within a short time.

In a display device according to an embodiment, the light source may include, for example, an organic light emitting diode (OLED).

Figure 5A:
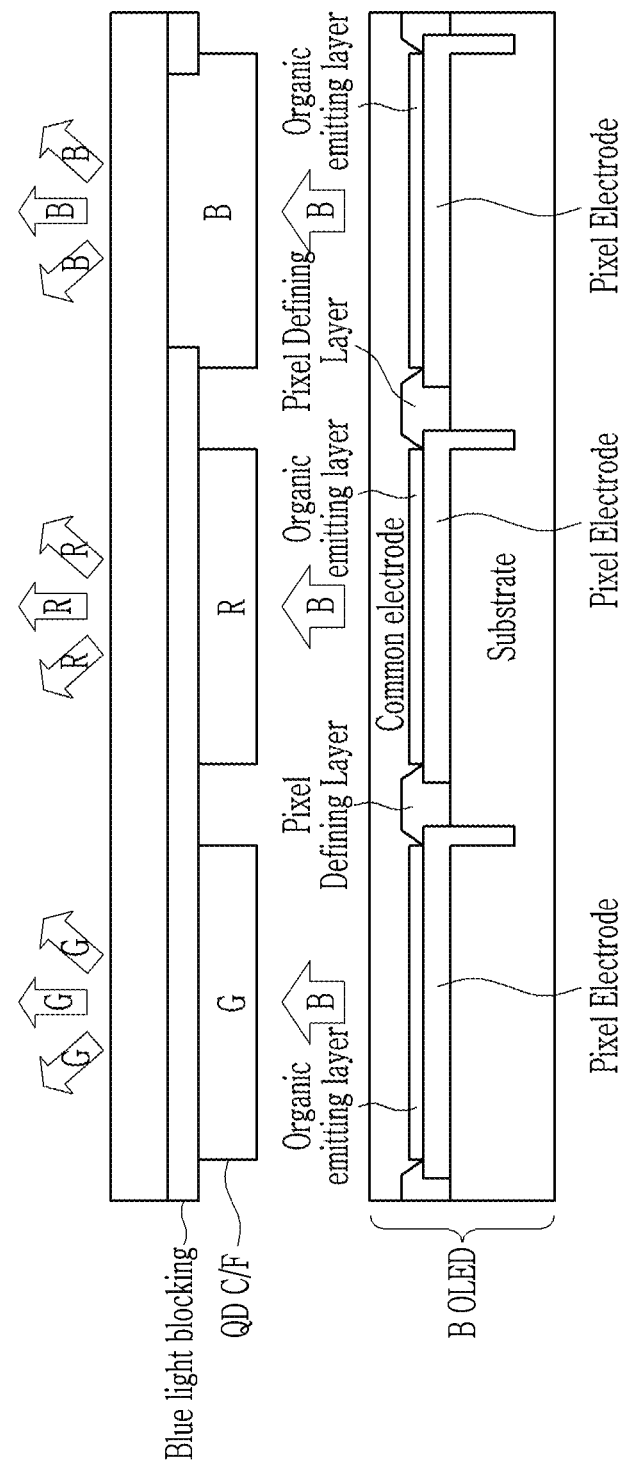
FIGS. 5A and 5B are schematic cross-sectional views showing display devices according to embodiments, respectively.
Figure 5B:
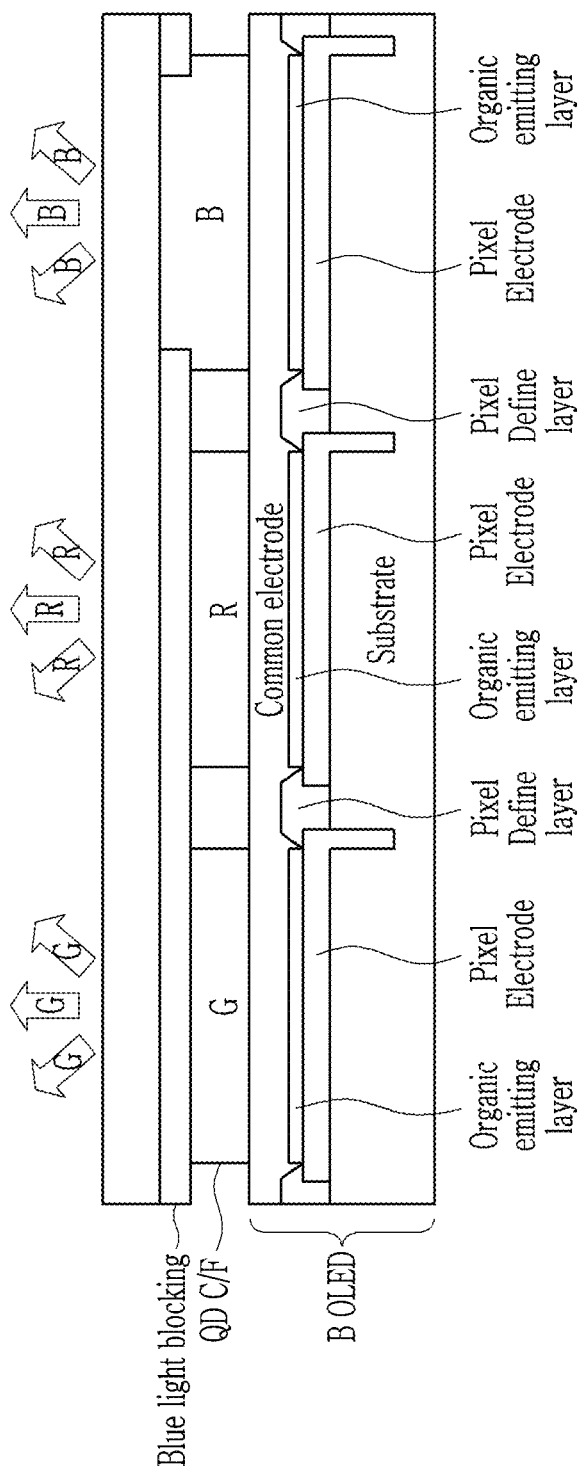

FIGS. 5A and 5B are schematic cross-sectional views of display devices according to embodiments. Referring to FIG. 5A and FIG. 5B, a light source may include an organic light emitting diode (OLED) (e.g., emitting blue light or light in a wavelength of less than or equal to about 500 nm). The organic light emitting diode (OLED) is the same as described above. Pixel areas of the organic light emitting diode (OLED) may be disposed corresponding to the first, second, and third sections.

On the light source, disposed is a stack structure including the pattern of the quantum dot-polymer composite (e.g., including a first section including red quantum dots and a second section including green quantum dots) and a substrate (e.g., directly on the light source). The (e.g., blue) light emitted from a light source enters the first section and the second section configured to emit red and green light, respectively. The blue light emitted from a light source may transmit the third section. An optical element (blue light blocking layer or first optical filter) blocking (e.g., reflecting or absorbing) blue light may be disposed on the first section emitting red light and the second section emitting green light.

The blue light blocking layer may be disposed on the substrate. The blue light blocking layer may be disposed on the first section and the second section between the substrate and the quantum dot-polymer composite pattern. A detailed description of the blue light blocking layer is the same as that of a first optical filter which will be described later.

Such a device may be manufactured by separately manufacturing the aforementioned stack structure and (e.g., blue light-emitting) OLED, and then, assembling them. The device may be manufactured by directly forming a quantum dot-polymer composite pattern on the OLED.

In an embodiment, the display device may further include a lower substrate, a polarizer disposed under the lower substrate, and a liquid crystal layer disposed between the stack structure and the lower substrate, wherein the stack structure is disposed so that the photoluminescent layer (hereinafter, also referred to as a quantum dot-polymer composite pattern) faces the liquid crystal layer. The display device may further include a polarizer between the liquid crystal layer and the photoluminescent layer. The light source may further include LED, and if desired, a light guide panel.

Figure 6:
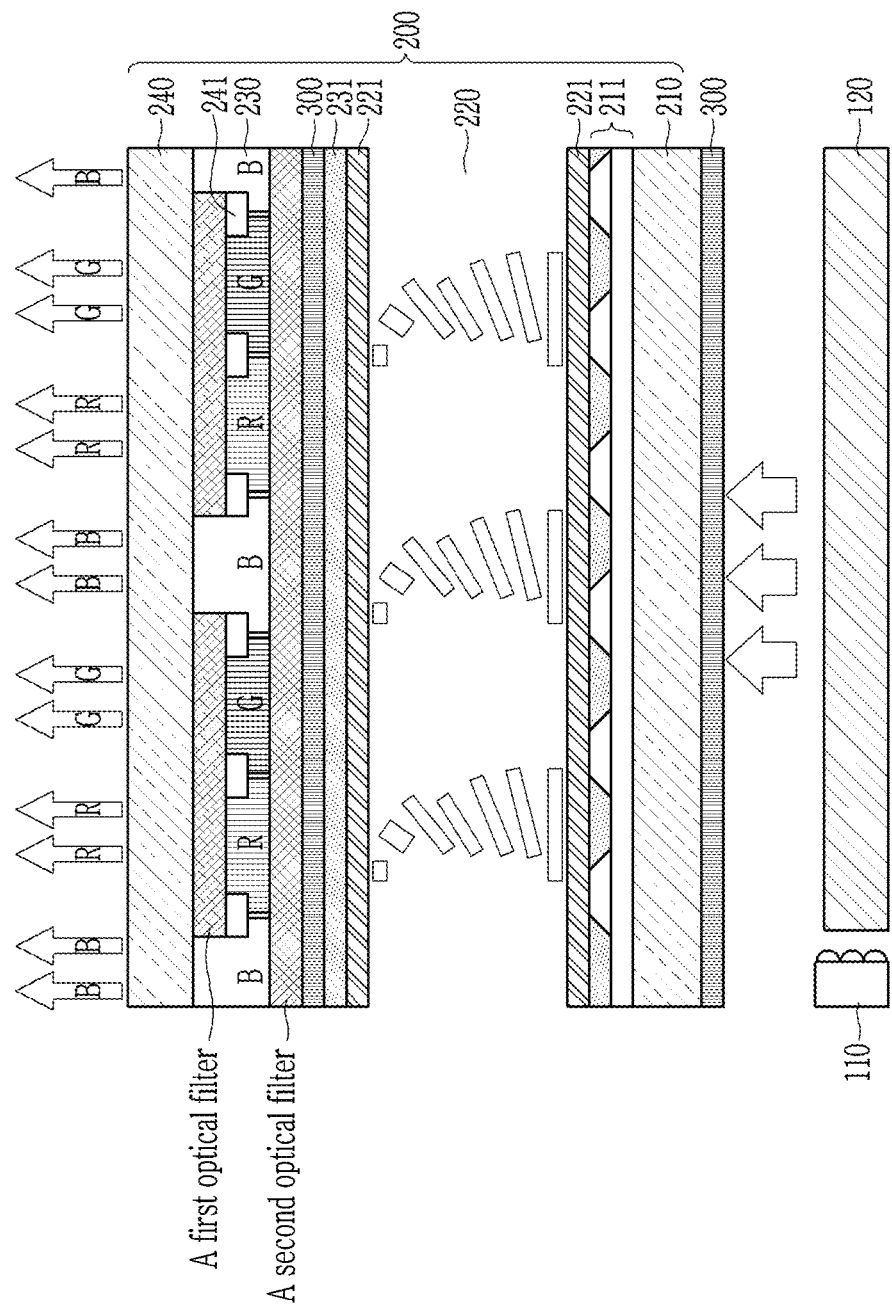
FIG. 6 is a cross sectional view showing a display device according to an embodiment.

Non-limiting examples of the display device (e.g., a liquid crystal display device) according to an embodiment are illustrated with a reference to a drawing. FIG. 6 is a schematic cross sectional view showing a liquid crystal display (LCD) according to an embodiment. Referring to FIG. 6, the display device of an embodiment includes a liquid crystal panel 200, a polarizer 300 disposed under the liquid crystal panel 200, and a backlight unit (BLU) disposed under the polarizer 300.

The liquid crystal panel 200 includes a lower substrate 210, a stack structure, and a liquid crystal layer 220 disposed between the stack structure and the lower substrate. The stack structure includes a (e.g., transparent and insulating) substrate 240 and a photoluminescent layer 230 including a quantum dot-polymer composite pattern.

The lower substrate 210 which is also referred to be an array substrate may be a transparent insulating material substrate. The substrate is the same as described above. A line plate 211 is provided on an upper surface of the lower substrate 210. The line plate 211 may include a plurality of gate lines (not shown) and data lines (not shown) that define a pixel area, a thin film transistor disposed adjacent to a crossing region of the gate lines and data lines, and a pixel electrode for each pixel area, but is not limited thereto. Details of such line plates are not particularly limited.

The liquid crystal layer 220 may be disposed on the line plate 211. The liquid crystal layer 220 may include an alignment layer 221 on and under the layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

A lower polarizer 300 is provided under the lower substrate. Materials and structures of the polarizer 300 are known and are not particularly limited. A backlight unit (e.g., emitting blue light) may be disposed under the polarizer 300. An upper optical element or an upper polarizer 300 may be provided between the liquid crystal layer 220 and the transparent substrate 240, but is not limited thereto. For example, the upper polarizer 300 may be disposed between the liquid crystal layer 220 and the photoluminescent layer 230. The polarizer may be any suitable polarizer that used in a liquid crystal display device. The polarizer may be TAC (triacetyl cellulose) having a thickness of less than or equal to about 200 µm, but is not limited thereto. In an embodiment, the upper optical element may be a coating that controls a refractive index without a polarization function.

The backlight unit includes a light source 110. The light source may emit blue light or white light. The light source may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector, a light guide panel provided on the reflector and providing a planar light source with the liquid crystal panel 200, at least one optical sheet on the light guide panel, for example, a diffusion plate, a prism sheet, and the like, or a combination thereof, but is not limited thereto. The backlight unit may not include a light guide panel. In an embodiment, the backlight unit may be a direct lighting. For example, the backlight unit may have a reflector, and may have a plurality of fluorescent lamps disposed on the reflector at regular intervals, or may have an LED operating substrate on which a plurality of light emitting diodes may be disposed, a diffusion plate thereon, and optionally at least one optical sheet. Details (e.g., each component of a light emitting diode, a fluorescent lamp, light guide panel, various optical sheets, and a reflector) of such a backlight unit are not particularly limited.

A black matrix (BM) 241 is provided under the transparent substrate 240 and has openings and hides a gate line, a data line, and a thin film transistor of the line plate on the lower substrate. For example, the black matrix 241 may have a lattice shape. The photoluminescent layer 230 is provided in the openings of the black matrix 241 and has a quantum dot-polymer composite pattern including a first section (R) configured to emit a first light (e.g., red light), a second section (G) configured to emit a second light (e.g., green light), and a third section (B) configured to emit/transmit, for example blue light. If desired, the photoluminescent layer may further include at least one fourth section. The fourth section may include quantum dots that emit light of a different color (e.g., cyan, magenta, and yellow) from light emitted from the first to third sections.

In the photoluminescent layer 230, sections forming a pattern may be repeated corresponding to pixel areas formed on the lower substrate. A transparent common electrode 231 may be provided on the photoluminescent layer.

The third section (B) configured to emit/transmit blue light may be a transparent color filter that does not change the emission spectrum of the light source. In this case, blue light emitted from the backlight unit may enter in a polarized state by passing through the polarizer and the liquid crystal layer, and may be emitted as is. If desired, the third section may include quantum dots emitting blue light.

Figure 4:
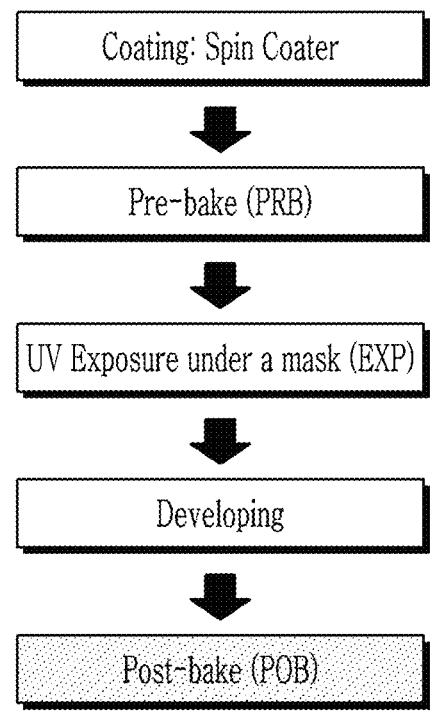
FIG. 4 is a schematic view showing a process of forming a quantum dot-polymer composite pattern according to an embodiment by using the composition according to an embodiment.
Figure 4:
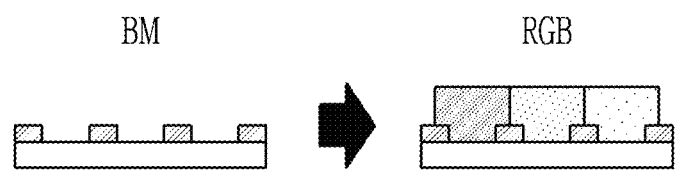

If desired, the display device may further have a blue light blocking layer (blue filter) or a first optical filter layer. The blue light blocking layer may be disposed between lower surfaces of the first section (R) and the second section (G) and the upper substrate 240, or on the upper surface of the upper substrate 240. The blue light blocking layer may be a sheet having an opening in a region corresponding to a pixel area (a third section) displaying blue, and thus formed in a region corresponding to the first and second sections. That is to say, the first optical filter layer may be disposed at the positions except the position overlapped with the third section, and integrally therewith as shown in FIG. 4, but is not limited thereto. For example, at least two first optical filter layers may be disposed leaving a space at each position overlapped with the first and second sections.

The first optical filter layer may block light having, for example, a predetermined wavelength region in the visible light region and may transmit light in the other wavelength regions, and, for example, may block blue light and may transmit light except the blue light. For example, the first optical filter layer may transmit green light, red light, and/or yellow which is a mixed color thereof.

The first optical filter layer may block, e.g., substantially block, for example, blue light having a wavelength of less than or equal to about 500 nm, and may have a property to transmit a wavelength region between the remaining visible light wavelength region of greater than about 500 nm and less than or equal to about 700 nm.

For example, the first optical filter layer may have a light transmittance of greater than or equal to about 70%, greater than or equal to about 80%, greater than or equal to about 90%, or about 100% for the other visible light in greater than or equal to 500 nm and less than or equal to about 700 nm.

The first optical filter layer may be a polymer thin film including a dye and a pigment absorbing a wavelength which is to be blocked, and may absorb blue light having a wavelength of less than or equal to 480 nm as much as greater than or equal to about 80%, greater than or equal to about 90%, greater than or equal to about 95%, but may have a light transmittance of greater than or equal to about 70%, greater than or equal to about 80%, greater than or equal to about 90%, and about 100% to the other visible light at greater than about 500 nm and less than or equal to about 700 nm.

The first optical filter layer may block, e.g., substantially block (e.g., absorb), blue light having a wavelength of less than or equal to about 500 nm by absorbing the same, and may selectively transmit, for example, green light, or red light. In this case, at least two first optical filter layers may be disposed spacing apart at each position which is overlapped with each of the first to second sections. For example, the first optical filter layer selectively transmitting red light may be disposed in a position which is overlapped with the red light emitting section, and the first optical filter layer selectively transmitting green light may be disposed on a position which is overlapped with the green light emitting section. For example, the first optical filter layer may include a first region to block (e.g., absorb) blue light and red light and to selectively transmit light in a predetermined range (e.g., greater than or equal to about 500 nm, greater than or equal to about 510 nm, or greater than or equal to or about 515 nm and less than or equal to about 540 nm, less than or equal to about 535 nm, less than or equal to about 530 nm, less than or equal to about 525 nm, or less than or equal to about 520 nm), a second region to block (e.g., absorb) blue light and green light and to selectively transmit light in a predetermined range (e.g., greater than or equal to about 600 nm, greater than or equal to about 610 nm, or greater than or equal to about 615 nm and less than or equal to about 640 nm, less than or equal to about 635 nm, less than or equal to about 630 nm, less than or equal to about 625 nm, or less than or equal to about 620 nm), or a combination thereof. The first region may be disposed at a position overlapped with the green light emitting section and the second region may be disposed at a position overlapped with the red light emitting section. The first region and the second region may optically be isolated. Such a first optical filter layer may contribute to improvement of color purity of the display device.

The first optical filter layer may be a reflective filter including a plurality of layers (e.g., inorganic material layer) having different refractive indexes, and for example, may be formed by alternately stacking two layers having different refractive indexes, for example, by alternately stacking a layer having a high refractive index and a layer having a low refractive index. As a refractive index difference between the layer having the high refractive index and the layer having the low refractive index is higher, the provided first optical filter layer has the higher selectivity to a wavelength. A thickness and the stacking number of the layer having a high refractive index and the layer having a low refractive index may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm.

The total thickness of the first optical filter layer may be, for example, about 3 nm to about 10,000 nm, for example about 300 nm to about 10,000 nm, for example about 1,000 nm to about 10,000 nm. All layers having a high refractive index may have the same thickness and the same material or different from each other, and all layers having a low refractive index may have the same thickness and the same material or different from each other.

The display device may further include a second optical filter layer (e.g., a red/green or yellow light recycle layer) disposed between the photoluminescent layer and the liquid crystal layer (e.g., the photoluminescent layer and the upper polarizer), transmitting at least a portion of third light, and reflecting at least a portion of the first light and/or second light. The second optical filter layer may reflect light in a wavelength region of greater than about 500 nm. The first light may be red light, the second light may be green light, and the third light may be blue light.

In the display device according to an embodiment, the second optical filter layer may be formed as an integrated layer having a relatively planar surface.

In an embodiment, the second optical filter layer may include a monolayer having a low refractive index, for example, the second optical filter may be a transparent thin film having a refractive index of less than or equal to about 1.4, less than or equal to about 1.3, or less than or equal to about 1.2.

The second optical filter layer having a low refractive index may be, for example, a porous silicon oxide, a porous organic material, a porous organic/inorganic composite, or a combination thereof.

In an embodiment, the second optical filter layer may include a plurality of layers having different refractive indexes, for example, the second optical filter layer may be formed by alternately stacking two layers having different refractive indexes, or for example, may be formed by alternately stacking material having a high refractive index and material having a low refractive index.

The layer having a high refractive index in the second optical filter layer may include, for example, a hafnium oxide, a tantalum oxide, a titanium oxide, a zirconium oxide, a magnesium oxide, a cesium oxide, a lanthanum oxide, an indium oxide, a niobium oxide, an aluminum oxide, and a silicon nitride, or a combination thereof, but according to embodiments, the layer having a high refractive index may include a variety of materials having a higher refractive index than the layer having a low refractive index.

The layer having a low refractive index in the second optical filter layer may include, for example, a silicon oxide, but according to embodiments, the layer having a low refractive index in the second optical filter layer may include a variety of materials having a lower refractive index than the layer having a high refractive index.

As the refractive index difference between the layer having a high refractive index and the layer having a low refractive index is the higher, the second optical filter layer may have the higher wavelength selectivity.

In the second optical filter layer, each thickness of the layer having a high refractive index and the layer having a low refractive index and the stacking number thereof may be determined depending upon a refractive index of each layer and the reflected wavelength, for example, each layer having a high refractive index in the second optical filter layer may have a thickness of about 3 nm to about 300 nm, and each layer having a low refractive index in the second optical filter layer may have a thickness of about 3 nm to about 300 nm. The total thickness of the second optical filter layer may be, for example, about 3 nm to about 10,000 nm, for example about 300 nm to about 10,000 nm, or about 1,000 nm to about 10,000 nm. Each of the layer having a high refractive index and the layer having a low refractive index in the second optical filter layer may have the same thickness and materials or different thickness and materials from each other.

The second optical filter layer may reflect at least a portion of the first light (R) and the second light (G) and may transmit at least a portion (e.g., whole portion) of the third light (B). For example, the second optical filter layer may transmit only the third light (B) in a blue light wavelength region having a wavelength region of less than or equal to about 500 nm and light in a wavelength region of greater than about 500 nm, which is green light (G), yellow light, red light (R), or the like, may be not passed through the second optical filter layer 140 and reflected. The reflected green light and red light may pass through the first and second sections and to be emitted to the outside of the display device 10.

The second optical filter layer may reflect a wavelength region of greater than about 500 nm in greater than or equal to about 70%, greater than or equal to about 80%, or greater than or equal to about 90%, or about 100%.

Meanwhile, the second optical filter layer may have a transmittance in a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or about 100%.

The display device may exhibit improved luminance (e.g., greater than or equal to about 100 nits (candelas per square meter)) and a wide viewing angle (e.g., greater than or equal to about 160°).

An embodiment provides an electronic device including the quantum dot-polymer composite. The device may include a light emitting diode (LED), an organic light emitting diode (OLED), a sensor, a solar cell, an imaging sensor, or a liquid crystal display (LCD), but is not limited thereto. The device has no particular limit regarding a structure and a material.

In an embodiment, an electronic device including the quantum dot-polymer composite may include an electroluminescent diode. In the electroluminescent device, the emission layer including the aforementioned quantum dot-polymer composite may be disposed between the anode and the cathode facing each other.

Figure 7:
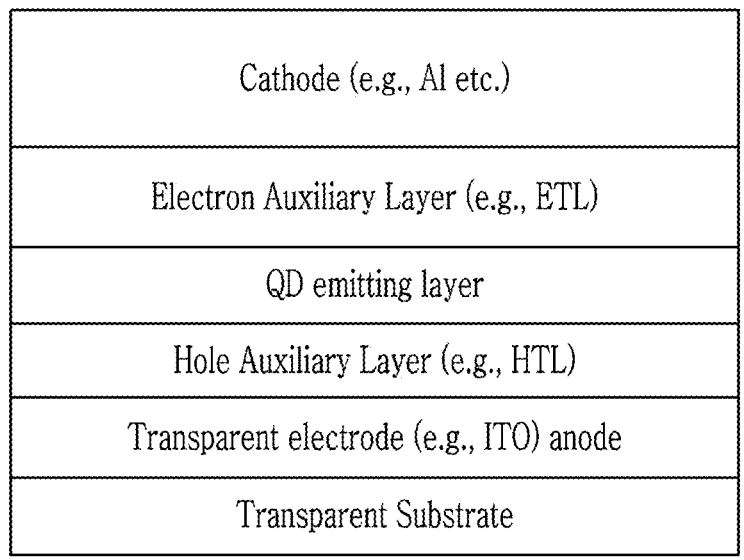
FIG. 7 is a schematic cross sectional view showing an electroluminescent device according to an embodiment.

In an embodiment, an anode disposed on a transparent substrate may include a metal oxide-based transparent electrode (e.g., ITO), and a cathode may include a metal (Mg, Al, etc.) having a predetermined (e.g., relatively low) work function. For example, poly((9,9-dioctylfluorenyl-2,7-diyl)-co-(4,4'-(N-(4-s-butylphenyl)diphenylamine)) (TFB), poly (N-vinylcarbazole) (PVK), or a combination thereof as a hole transport layer, poly(3,4-ethylenedioxythiophene) polystyrene sulfonate (PEDOT:PSS), a p-type metal oxide, or a combination thereof as a hole injection layer, or a combination thereof may be disposed between the transparent electrode and the emission layer. An electron auxiliary layer (e.g., electron transport layer, etc.) may be disposed between the quantum dot emission layer and the cathode (refer to: FIG. 7).

Figure 8:
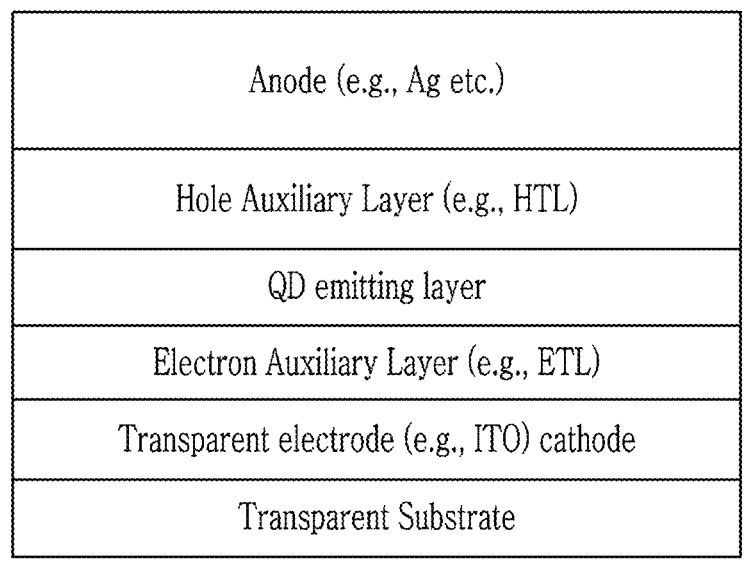
FIG. 8 is a schematic cross sectional view showing an electroluminescent device according to an embodiment.

In an embodiment, the light emitting device may have an inverted structure. Herein, a cathode disposed on a transparent substrate may include a metal oxide-based transparent electrode (e.g., ITO, fluorine doped tin oxide (FTO), etc.), and an anode may include a metal (e.g., Au, Ag, etc.) of a predetermined (e.g., relatively high) work function. For example, an n-type metal oxide (ZnO) may be disposed between the cathode and the emission layer as an electron auxiliary layer (e.g., an electron transport layer (ETL)). A hole auxiliary layer (e.g., a hole transport layer (HTL) including TFB, PVK, or a combination thereof, a hole injection layer including $MoO_3$ or other p-type metal oxide), or a combination thereof may be disposed between the metal anode and the quantum dot emission layer. (Refer to FIG. 8) Hereinafter, the embodiments are illustrated in more detail with reference to examples. However, they are exemplary examples of the present disclosure, and the present disclosure is not limited thereto.

EXAMPLES

Analysis Methods

1. Ultraviolet-Visible (UV-Vis) Spectroscopy

A UV spectroscopy is performed by using an Agilent Cary 5000 spectrometer to obtain a UV-Visible absorption spectrum.

2. Photoluminescence Analysis

A photoluminescence (PL) spectrum of a quantum dot-polymer composite at an irradiation wavelength of 458 nanometers (nm) (532 nm for a red quantum dot (QD)) is obtained by using a Hitachi F-7000 spectrometer.

3. Photo-Conversion Efficiency (CE)

A photo-conversion efficiency of a quantum dot-polymer composite film is obtained by inserting the quantum dot-polymer composite film between a light guide panel and an optical sheet of 60-inch television (TV) equipped with blue LED having a peak wavelength of 449 nm, operating the TV to analyze photoluminescence characteristics with a spectroradiometer (CS-2000, Konica Minolta Co.) positioned in front of and 45 centimeters (cm) away from the TV to obtain a photoluminescence spectrum of the emitted light, and calculating the photo-conversion efficiency (CE) from the photoluminescence spectrum.

4. Relative Quantum Efficiency (Quantum Yield: QY) of Quantum Dot

QY (quantum yield) of quantum dots in a quantum dot-polymer composite is measured in the following method:

$$QY = QY_R * OD_R / OD_{sample} * I_{sample} / I_R * (n_{sample})^2 / (n_R)^2$$

OD: Optical Density (determined by absorption intensity in a UV spectrum)

I: Integrated Intensity (a total integral value of a PL spectrum-phased emission peak area)

n: a refractive index of a solvent $_R$: Reference dye (ex. Coumarine-green, rhodamine 6G—red)

Sample: synthesized QD sample

5. Luminance and Luminous Efficiency of Quantum Dot-Polymer Composite (1) Luminance Measurement of Quantum Dot-Polymer Composite:

A quantum dot-polymer composite film is inserted between a light guide panel and an optical sheet of 60 inch TV equipped with blue LED having a peak wavelength of 449 nm. Luminance of the quantum dot-polymer composite is measured by operating TV and using a PSI DARSA-5200 spectrometer in front of and about 45 cm away from the TV.

(2) Measurement of Photo-Conversion Efficiency (CE) of Quantum Dot-Polymer Composite:

A quantum dot-polymer composite film is put in an integrating sphere, QE-2100 (Otsuka Ellectronics Co., LTD) and photo-conversion efficiency (CE %) of the composite film is measured, while the quantum dot-polymer composite film is radiated by excitation light of 450 nm. The photo-conversion efficiency of the film is obtained in the aforementioned method.

6. TEM (Transmission Electron Microscopy) Analysis

A transmission electron microscope analysis is performed by using a Titan ChemiSTEM electron microscope.

Synthesis Example: Preparation of Scattering Body-Dispersion (1) Control Synthesis Example, Comparative Synthesis Example 1-1, and Synthesis Example 1-1: Preparation of Scattering Body-Dispersion TiO$_2$ particulates (average particle diameter of 200 nm) (Control Synthesis Example), core-shell TiO$_2$ particulates (including an SiO$_2$ core (average particle diameter of 400 nm) and a TiO$_2$ shell (shell thickness of 35 nm)) (Comparative Synthesis Example 1-1), and hollow silica SiO$_2$ particulates (average particle diameter of 300 nm, hollow diameter of 250 nm) (Synthesis Example 1-1) in each amount of 20 weight percent (wt %) are respectively added to propylene glycol monomethyl ether acetate (PGMEA) as a solvent based on a total weight of each dispersion as a scattering body, that is, a weight sum of the solvent and the scattering body, and the mixture is ball-milled for 60 minutes to prepare each scattering body-dispersion according to the Control Synthesis Example, Comparative Synthesis Example 1-1, and Synthesis Example 1-1.

Figure 9:
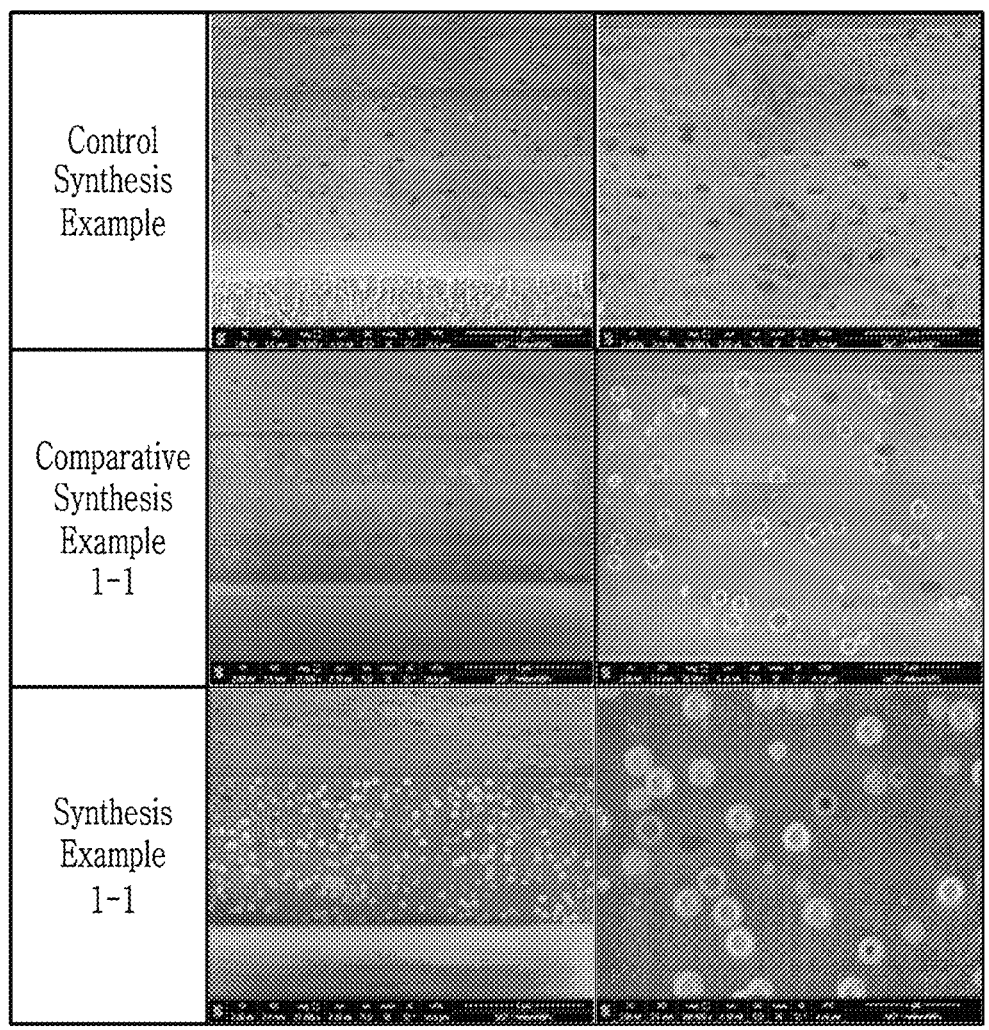
FIG. 9 is a TEM (Transmission Electronic Microscopy) image showing a cross section of each film prepared by coating each scattering body-dispersion of the Control Synthesis Example, Comparative Synthesis Example 1-1, and Synthesis Example 1-1.

The scattering body-dispersions are respectively coated in an equal amount to have the same thickness and dried, and a TEM image of a cross-section thereof is shown in FIG. 9. As shown in a left image of FIG. 9, when a scattering body is included in the same amount (the same wt %), a film including hollow silica according to Synthesis Example 1-1 has smaller hollow silica density and thus includes much more scattering body particles in the same area than a film according to the Control Synthesis Example or Comparative Synthesis Example 1-1. Without being bound to any specific theory, it is believed that a scattering degree may increase with an increase of the number of scattering bodies, and as shown in the following experiment result, scattering efficiency may increase, e.g., significantly, as the number of scattering bodies increases. A right image of FIG. 9 is obtained by enlarging the left image. A non-hollow particulate-shaped scattering body of the Control Synthesis Example, a core shell-shaped scattering body of Comparative Synthesis Example 1-1, and a hollow particulate shaped scattering body of Synthesis Example 1-1 are clearly different one another.

(2) Comparative Synthesis Example 1-2 and Synthesis Example 1-2: Synthesis of Scattering Body-Dispersion Each scattering body-dispersion is prepared according to the same method as Comparative Synthesis Example 1-1 and Synthesis Example 1-1 by further adding a dispersing agent binder facilitating dispersion of a scattering body in addition to PGMEA as a solvent.

Specifically, each scattering body-dispersion according to Comparative Synthesis Example 1-2 and Synthesis Example 1-2 is prepared by adding a polyester having a weight average molecular weight of about 3,000 g/mol as a dispersing agent to propylene glycol monomethyl ether acetate (PGMEA) as a solvent to be 20 wt %, based on a total weight of dispersion, respectively adding a core-shell TiO$_2$ particulate as in Comparative Synthesis Example 1-1 and hollow silica as in Synthesis Example 1-1 to the solvent to be 20 wt %, based on a total weight of the solvent, the dispersing agent, and the scattering body and then, ball-milling each mixture for 60 minutes.

Example: Preparation of Composition for Manufacturing Quantum Dot-Polymer Composite Chloroform dispersion of quantum dots (InP/ZnS core-shell quantum dots having oleic acid as an organic ligand on the surface, emitting red light) is prepared. The quantum dot chloroform dispersion is mixed with a solution of a quaternary copolymer binder of methacrylic acid, benzyl methacrylate, hydroxyethyl methacrylate, and styrene (acid value: 130 mg KOH/g, molecular weight: 8,000 g/mol, mole ratio of methacrylic acid:benzyl methacrylate:hydroxyethyl methacrylate:styrene is 61.5%:12%:16.3%:10.2%) (solid content of 30 wt % in propylene glycol monomethyl ether acetate) to prepare quantum dot-binder dispersion. The quantum dots are uniformly dispersed in the quantum dot-binder dispersion, when examined with naked eyes.

Each composition for manufacturing a quantum dot-polymer composite according to the Control Example, Comparative Examples 1-1 and 1-2, and Examples 1-1 and 1-2 is prepared by mixing the quantum dot-binder dispersion with glycol-di-3-mercaptopropionate represented by Chemical Formula 2 (hereinafter, 2T), hexaacrylate represented by Chemical Formula 3 as a photopolymerizable monomer, an oxime ester compound as an initiator, and the scattering body-dispersion according to Synthesis Example:

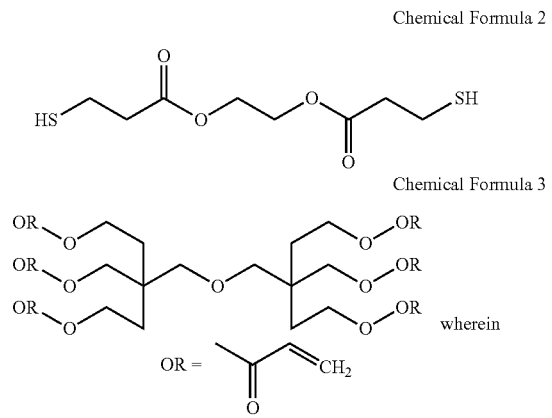

Chemical Formula 2

Chemical Formula 3 wherein $OR = $ [acrylate group structure]

Each composition includes 25 wt % of a solid, and based on a total amount of the solid, 43 wt % of quantum dots, 12.0 wt % of the quaternary copolymer binder as a dispersing agent for dispersing the quantum dots, 10.0 wt % of hexaacrylate represented by Chemical Formula 3 as a photopolymerizable monomer, 0.5 wt % of an oxime ester compound Chemical Formula 3 as an initiator, 25 wt % of the thiol compound 2T represented by Chemical Formula 2, and 9.5 wt % of each scattering body of $TiO_2$ particulates (Control Synthesis Example), core-shell $TiO_2$ (Comparative Synthesis Example), or hollow $SiO_2$ (Synthesis Example) respectively.

Preparation Example and Evaluation: Formation and Evaluation of Quantum Dot-Polymer Composite Pattern The compositions according to the Control Example, the Example, and the Comparative Example are respectively spin-coated on a glass substrate at 180 revolutions per minute (rpm) for 5 seconds to obtain each film. The film is pre-baked at 100° C. Herein, each film according to the Control Example, the Example, and the Comparative Example is prepared into two films having a different thickness, which are applied to the following experiment, and the results are shown.

A photoluminescence (PL) spectrum of the pre-baked film (PRB) is obtained by using a Hitachi F-7000 spectrometer as described in the aforementioned analysis method, and an emission peak, a full width at half maximum (FWHM), and QE of the film are measured therefrom. In addition, a UV absorption rate (Abs) is obtained through UV-Vis spectroscopy, and a photo-conversion efficiency (CE) is calculated from the photoluminescence spectrum, and the results are shown in Table 1.

Subsequently, the pre-baked film is radiated by light (wavelength: 365 nm, intensity: 100 millijoules (mJ)) for one second under a mask having a predetermined pattern, and then, developed with a potassium hydroxide aqueous solution (concentration: 0.043%, pH: 11) for 50 seconds to obtain a pattern (line width: 100 micrometers (μm)). When the pattern is radiated by blue light (wavelength of 450 nm), the pattern emits red light. In addition, after once heating the pattern at 180° C. for 30 minutes, an emission peak, a full width at half maximum (FWHM), QE, Abs, and a photo-conversion efficiency of the pattern are measured as in the pre-baked film, and the results are shown in Table 1.

TABLE 1

| Scattering body-dispersion | | Control Example Control Synthesis Example | | Comparative Example 1-1 Comparative Synthesis Example 1-1 | | Comparative Example 1-2 Comparative Synthesis Example 1-2 | |
|---|---|---|---|---|---|---|---|
| | | Experiment 1 | Experiment 2 | Experiment 1 | Experiment 2 | Experiment 1 | Experiment 2 |
| Thickness (μm) | | 6.30 | 6.60 | 6.30 | 6.70 | 6.70 | 6.80 |
| PRB (Air ref.) | Peak (nm) | 543.5 | 543.8 | 548.7 | 546.3 | 548.7 | 546.1 |
| | FWHM (nm) | 36 | 36 | 38 | 38 | 38 | 38 |
| | QE | 27.5% | 27.9% | 11.1% | 12.3% | 11.4% | 11.7% |
| | Abs | 86.7% | 87.5% | 38.6% | 40.4% | 38.8% | 39.9% |
| | CE | 31.7% | 31.9% | 28.8% | 30.4% | 29.4% | 29.3% |
| POB (Air ref.) | Peak (nm) | 544.5 | 545 | 547.9 | 547.2 | 547.3 | 547.7 |
| | FWHM (nm) | 36 | 36 | 38 | 38 | 38 | 39 |
| | QE | 26.8% | 27.4% | 12.6% | 13.7% | 12.2% | 12.5% |
| | Abs | 86.5% | 87.2% | 40.8% | 42.3% | 40.6% | 42.3% |

TABLE 1-continued

| | | | | | | |
|---|---|---|---|---|---|---|
| CE | 31.0% | 31.4% | 30.9% | 32.4% | 30.0% | 29.6% |
| POB QE/PRB QE × 100% | 97% | 98% | 114% | 111% | 107% | 107% |

| Scattering body-dispersion | | | Example 1-1 Synthesis Example 1-1 | | Example 1-2 Synthesis Example 1-2 | |
|---|---|---|---|---|---|---|
| | | | Experiment 1 | Experiment 2 | Experiment 1 | Experiment 2 |
| | Thickness (μm) | | 6.60 | 6.66 | 7.00 | 7.20 |
| PRB (Air ref.) | Peak (nm) | | 544.4 | 543.7 | 543.4 | 545.1 |
| | FWHM (nm) | | 36 | 36 | 36 | 36 |
| | QE | | 26.2% | 26.6% | 26.9% | 27.1% |
| | Abs | | 71.3% | 71.9% | 72.5% | 73.1% |
| | CE | | 36.7% | 37.0% | 37.1% | 37.1% |
| POB (Air ref.) | Peak (nm) | | 544.2 | 544.3 | 544.9 | 544.9 |
| | FWHM (nm) | | 36 | 37 | 36 | 36 |
| | QE | | 26.3% | 26.6% | 27.3% | 27.6% |
| | Abs | | 75.2% | 75.7% | 76.5% | 76.8% |
| | CE | | 35.0% | 35.1% | 35.7% | 35.9% |
| POB QE/PRB QE × 100% | | | 100% | 100% | 101% | 102% |

In Table 1, POB denotes a post-baked film, that is, a film obtained by heating the pre-baked film at 180° C. for 30 minutes after patterning it.

Referring to Table 1, each quantum dot-polymer composite film (or pattern) including hollow silica as a scattering body of Examples 1-1 and 1-2 exhibits a relatively high photo-conversion efficiency (CE) compared with each film of the Control Example or Comparative Examples 1-1 and 1-2. The post-baked pattern of the Control Example exhibits a CE of about 31%, but the patterns including hollow silica of Examples 1-1 and 1-2 exhibit a CE of greater than or equal to 35%. On the other hand, the core-shell type quantum dot-polymer composite patterns of Comparative Examples 1-1 and 1-2 exhibit a similar photo-conversion efficiency (CE), but a lower absorption rate (Abs) than the core-shell type quantum dot-polymer composite pattern of the Control Example.

Figure 10:
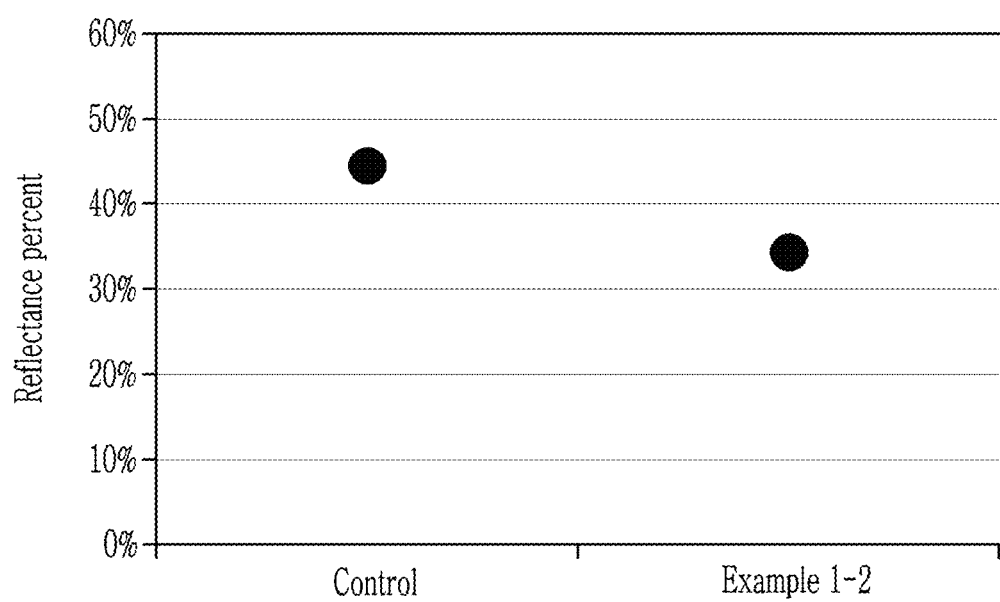
FIG. 10 is a graph of reflectance (wherein SCI is specular component included) of a quantum dot-polymer composite including $TiO_2$ particulates as scattering bodies of the Control Example and a quantum dot-polymer composite including hollow silica as scattering bodies of Example 1-2.

On the other hand, FIG. 10 shows reflectance (SCI) results of each quantum dot-polymer composite of Experiment 2 of the Control Example and Experiment 2 of Example 1-2. Referring to FIG. 10, the composite film including hollow silica as a scattering body of Example 1-2 exhibits lower reflectance than the composite film including TiO$_2$ particulates as scattering bodies of the Control Example. Accordingly, a composition for manufacturing a quantum dot-polymer composite, which includes hollow silica as a scattering body according to an embodiment has an effect of reducing reflectance.

Additional Experiment: Characteristics Evaluation of Composite-Shaped Scattering Body A composition for manufacturing a quantum dot-polymer composite is prepared according to the same method as the Examples except for using a mixed scattering body-dispersion including TiO$_2$ particulates of the Control Synthesis Example and hollow silica of Synthesis Example 1-1 in a predetermined amount, that is, a weight of hollow silica relative to a total weight of scattering bodies (e.g., total weight of solids in the scattering body-dispersion) in a range of 3 wt % to 100 wt % in the same total weight of solids as that of each scattering body-dispersion according to the Examples.

The composition is respectively spin-coated on a glass substrate at 180 rpm for 5 seconds to obtain a film, and the film is pre-baked at 100° C. and once additionally post-baked at 180° C. for 30 minutes. CE, quantum efficiency (QE), and a maintenance percent of each obtained film are shown in FIGS. 11 to 13.

Figure 11:
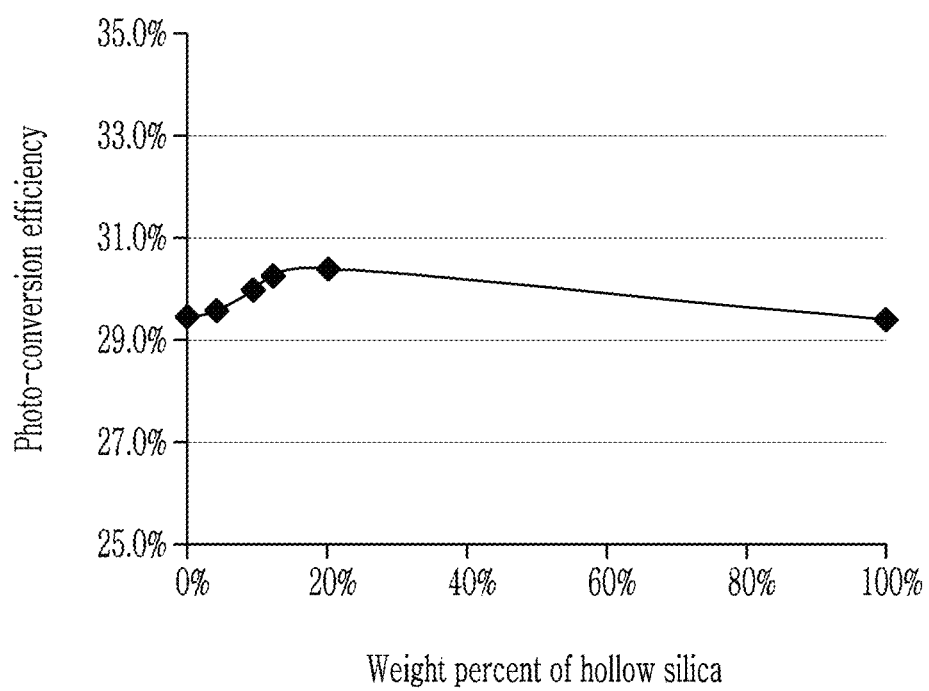
FIG. 11 is a graph of photo-conversion efficiency (CE: Conversion Efficiency (percent (%))) versus weight percent of hollow silica in a quantum dot-polymer composite film including a mixture of $TiO_2$ particulates and hollow silica as scattering bodies, based on total weight of scattering bodies.
Figure 12:
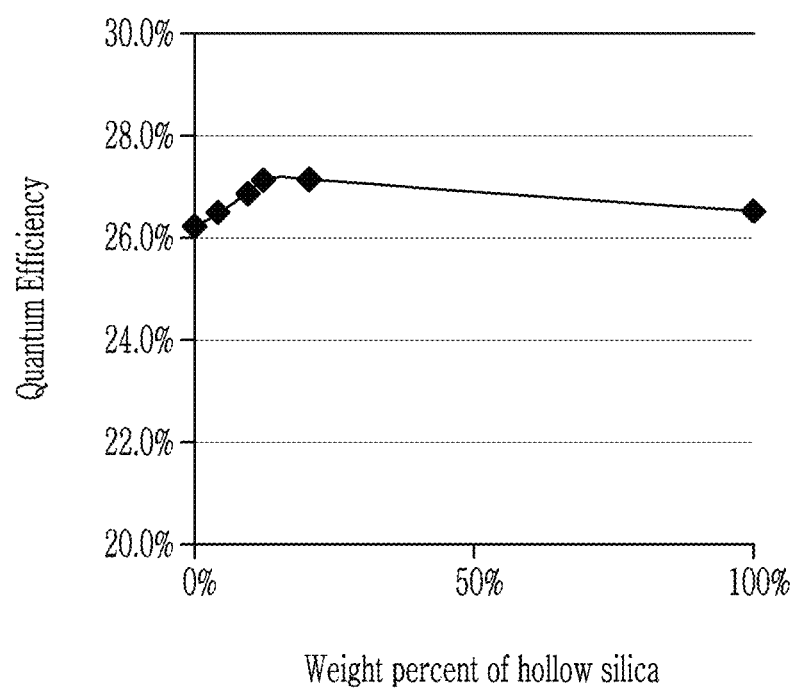
FIG. 12 is a graph of Quantum Efficiency (%) versus weight percent of hollow silica in the quantum dot-polymer composite film including the mixture of $TiO_2$ particulates and hollow silica as scattering bodies, based on total weight of scattering bodies.
Figure 13:
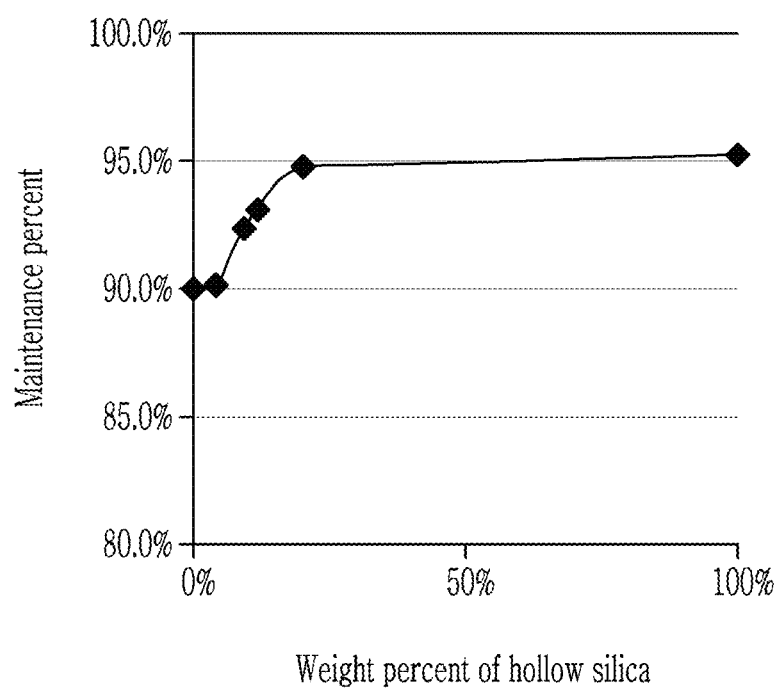
FIG. 13 is a graph of maintenance percent (%) versus weight percent of hollow silica in the quantum dot-polymer composite film including the mixture of $TiO_2$ particulates and hollow silica as scattering bodies, based on total weight of scattering bodies.

Referring to FIGS. 11 to 13, when a content of hollow silica is about 20 wt %, based on a total content of the scattering body, the most excellent characteristics of CE, quantum efficiency (QE), and a maintenance percent are obtained.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A composition comprising
   a quantum dot,
   a dispersing agent for dispersing the quantum dot,
   a polymerizable monomer comprising a carbon-carbon double bond,
   an initiator,
   a hollow metal oxide particulate, and
   a solvent.

2. The composition of claim 1, wherein the hollow metal oxide particulate comprises a titanium oxide, a silicon oxide, a barium oxide, a zinc oxide, a zirconium oxide, or a combination thereof.

3. The composition of claim 1, wherein the hollow metal oxide particulate comprises TiO$_2$, SiO$_2$, BaTiO$_3$, Ba$_2$TiO$_4$, ZnO, ZrO$_2$, or a combination thereof.

4. The composition of claim 1, wherein an average particle size of the hollow metal oxide particulate ranges from about 200 nanometers to about 500 nanometers.

5. The composition of claim 1, wherein an average particle size of the hollow metal oxide particulate ranges from about 250 nanometers to about 450 nanometers.

6. The composition of claim 1, wherein an average size of a hollow portion in the hollow metal oxide particulate is greater than or equal to about 10 nanometers and less than about 500 nanometers.

7. The composition of claim 1, wherein an average size of a hollow portion in the hollow metal oxide particulate is greater than or equal to about 30 nanometers and less than or equal to about 450 nanometers.

8. The composition of claim 1, wherein the quantum dot comprises a Group II-VI compound, a Group III-V compound, a Group IV-VI compound, a Group IV element or compound, a Group compound, a Group I-II-IV-VI compound, or a combination thereof.

9. The composition of claim 1, wherein the dispersing agent comprises a carboxyl group-containing polymer and the carboxyl group-containing polymer comprises
 a copolymer of a monomer combination comprising a first monomer comprising a carboxyl group and a carbon-carbon double bond, a second monomer comprising a carbon-carbon double bond and a hydrophobic moiety and not comprising a carboxyl group, and optionally a third monomer comprising a carbon-carbon double bond and a hydrophilic moiety and not comprising a carboxyl group;
 a multiple aromatic ring-containing polymer comprising a backbone structure in which two aromatic rings are bound to a quaternary carbon atom that is a constituent atom of another cyclic moiety in the backbone and comprising a carboxyl group; or
 a combination thereof.

10. The composition of claim 9, wherein the carboxyl group-containing polymer has an acid value of greater than or equal to about 50 milligrams of potassium hydroxide per gram less than or equal to about 240 milligrams of potassium hydroxide per gram.

11. The composition of claim 1, further comprising a thiol compound comprising a thiol group at a terminal end of the thiol compound.

12. The composition of claim 11, wherein the thiol compound is represented by Chemical Formula 1:

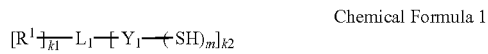

Chemical Formula 1 wherein, in Chemical Formula 1,
R$^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —NH$_2$; a substituted or unsubstituted C1 to C30 amine group of the formula —NRR', wherein R and R' are independently hydrogen or a C1 to C30 linear or branched alkyl group and are not simultaneously hydrogen; an isocyanate group of the formula —R-M=C=O, wherein R is a substituted or unsubstituted C1 to C20 alkylene group and M is an organic or inorganic cation; a halogen; —ROR' wherein R is a substituted or unsubstituted C1 to C20 alkylene group and R' is hydrogen or a C1 to C20 linear or branched alkyl group; an acyl halide of the formula —RC(=O)X, wherein R is a substituted or unsubstituted alkylene group and X is a halogen; —C(=O)OR', wherein R' is hydrogen or a C1 to C20 linear or branched alkyl group; —CN; —C(=O)ORR' or —C(=O)ONRR', wherein R and R' are independently hydrogen or a C1 to C20 linear or branched alkyl group, L$_1$ is a carbon atom, a substituted or unsubstituted C1 to C30 alkylene group, a substituted or unsubstituted C1 to C30 alkylene group wherein at least one methylene moiety is replaced by a sulfonyl moiety, a carbonyl moiety, —O—, —S—, —SO—, —C(=O)O—, —C(=O)NR— wherein, R is hydrogen or a C1 to C10 alkyl group, or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene moiety, Y$_1$ is a single bond; a substituted or unsubstituted C1 to C30 alkylene group; a substituted or unsubstituted C2 to C30 alkenylene group; a C1 to C30 alkylene group or a C2 to C30 alkenylene group wherein at least one methylene moiety is replaced by a sulfonyl moiety, a carbonyl moiety, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof, m is an integer of 1 or more,
k1 is 0 or an integer of 1 or more,
k2 is an integer of 1 or more, and
the sum of m and k2 is an integer of 3 or more, provided that m does not exceed the valence of Y$_1$ and the sum of k1 and k2 does not exceed the valence of L$_1$.

13. The composition of claim 1, wherein an amount of the quantum dot is greater than or equal to about 10 weight percent, and an amount of the hollow metal oxide particulate is greater than or equal to about 5 weight percent, based on a total weight of solids in the composition.

14. The composition of claim 1, wherein an amount of the hollow metal oxide particulate is about 5 weight percent to about 80 weight percent, based on a total weight of solids in the composition.

15. A quantum dot-polymer composite comprising the composition of claim 1.

16. A display device, comprising
a light source, and
a photoluminescent element,
wherein the photoluminescent element comprises the quantum dot-polymer composite of claim 15, and
the light source is configured to provide the photoluminescent element with incident light.

17. The display device of claim 16, wherein the incident light has a photoluminescence peak wavelength of about 440 nanometers to about 460 nanometers.

18. The display device of claim 16, wherein the photoluminescent element comprises a sheet comprising the quantum dot-polymer composite.

19. The display device of claim 16, wherein the photoluminescent element has a stack structure comprising a substrate and a photoluminescent layer disposed on the substrate, wherein the photoluminescent layer comprises a pattern of the quantum dot-polymer composite, and the pattern comprises at least one repeating section emitting light in a predetermined wavelength.

20. The display device of claim 19, wherein the pattern comprises a first section configured to emit a first light and a second section configured to emit a second light having a different center wavelength from the first light.

* * * * *